United States Patent
Kurosawa et al.

(10) Patent No.: US 7,060,593 B2
(45) Date of Patent: Jun. 13, 2006

(54) METHOD OF AND MECHANISM FOR PEELING ADHESIVE TAPE BONDED TO SEGMENTED SEMICONDUCTOR WAFER

(75) Inventors: Tetsuya Kurosawa, Yokohama (JP); Shinya Takyu, Kitakatsushika-gun (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 338 days.

(21) Appl. No.: 10/254,982

(22) Filed: Sep. 26, 2002

(65) Prior Publication Data
US 2003/0060021 A1 Mar. 27, 2003

(30) Foreign Application Priority Data
Sep. 27, 2001 (JP) ............................ 2001-298509
Sep. 18, 2002 (JP) ............................ 2002-271536

(51) Int. Cl.
*H01L 21/46* (2006.01)
*H01L 21/50* (2006.01)

(52) U.S. Cl. ...................................... 438/464; 438/110

(58) Field of Classification Search ............... 438/460, 438/464, 110
See application file for complete search history.

(56) References Cited

U.S. PATENT DOCUMENTS

| 4,865,677 | A | | 9/1989 | Matsushita et al. |
| 5,803,797 | A | * | 9/1998 | Piper ........................ 451/182 |
| 6,204,092 | B1 | * | 3/2001 | Freund et al. ............. 438/113 |
| 6,297,075 | B1 | * | 10/2001 | Odajima et al. ........... 438/110 |
| 6,448,155 | B1 | * | 9/2002 | Iwasaki et al. ............ 438/464 |
| 6,461,942 | B1 | * | 10/2002 | Watanabe et al. .......... 438/464 |

FOREIGN PATENT DOCUMENTS

| JP | 64-43458 | 2/1989 |
| JP | 2000-91281 | 3/2000 |
| JP | 2000-315697 | 11/2000 |
| KR | 1996-0009988 | 7/1996 |

* cited by examiner

*Primary Examiner*—Scott Geyer
(74) *Attorney, Agent, or Firm*—Finnegan, Henderson, Farabow, Garrett & Dunner, L.L.P.

(57) ABSTRACT

An adhesive tape peeling mechanism has an adhering section and a porous member. The adhering section adheres to a segmented semiconductor wafer bonded to adhesive tape. The porous member is provided on the surface adhering to the semiconductor wafer of the adhering section. The porous member is divided into at least two adhering areas in the direction in which the adhesive tape is peeled. The porous member adheres to the semiconductor wafer by suction and fixes the wafer in place.

2 Claims, 32 Drawing Sheets

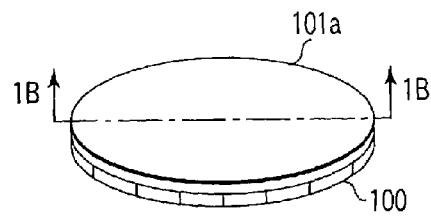
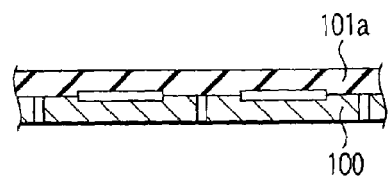
FIG. 1A PRIOR ART
FIG. 1B PRIOR ART
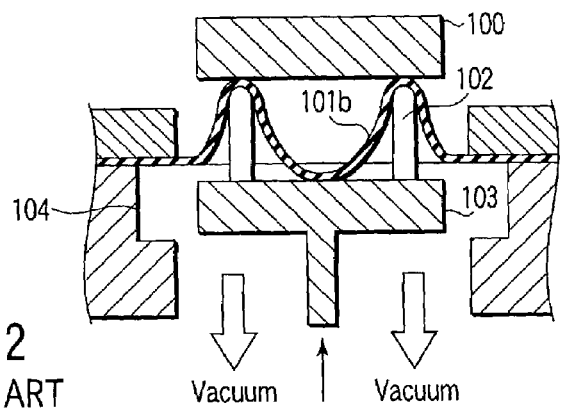
FIG. 2 PRIOR ART
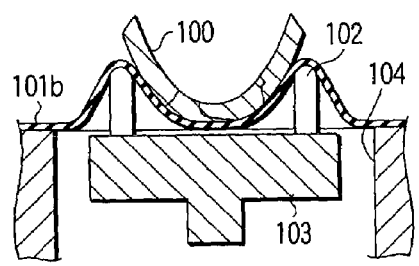
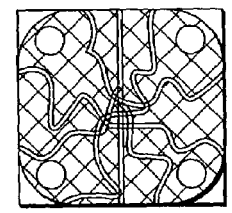
FIG. 3A PRIOR ART
FIG. 3B PRIOR ART
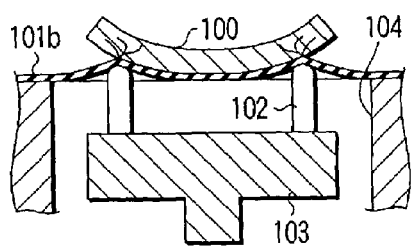
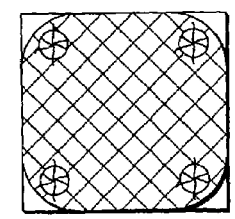
FIG. 4A PRIOR ART
FIG. 4B PRIOR ART

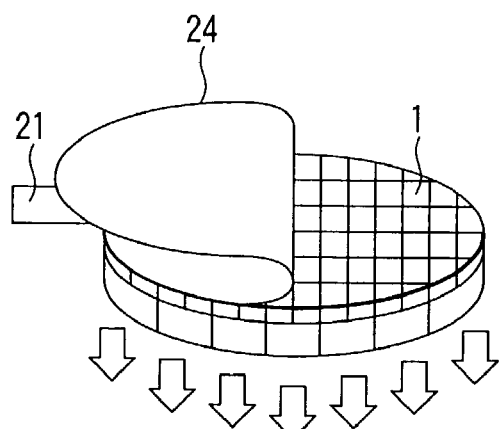
F I G. 12A
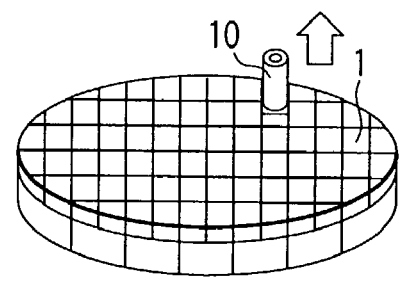
F I G. 12B
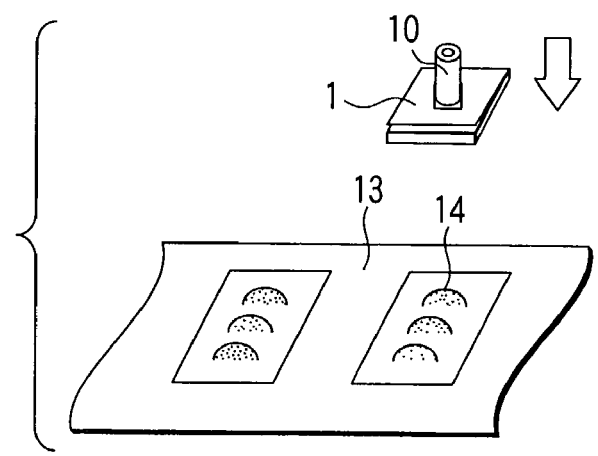
F I G. 12C

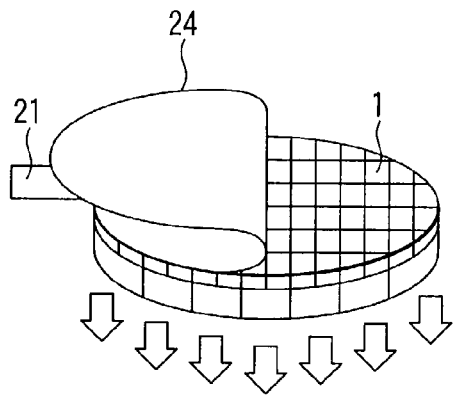
F I G. 14A
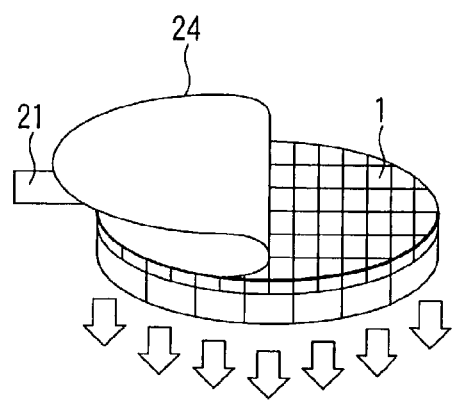
F I G. 15A
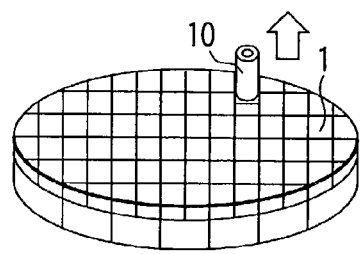
F I G. 14B
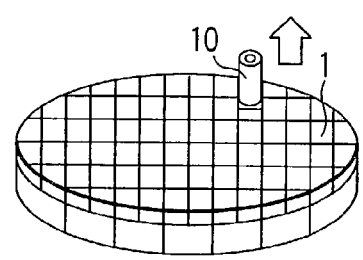
F I G. 15B
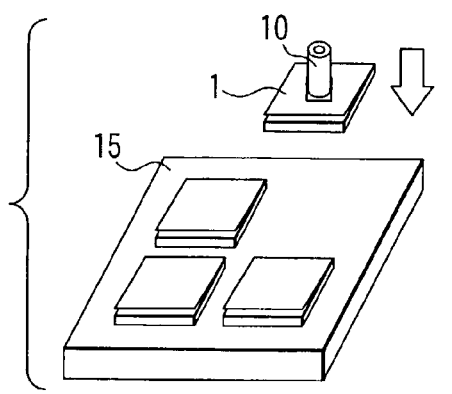
F I G. 14C
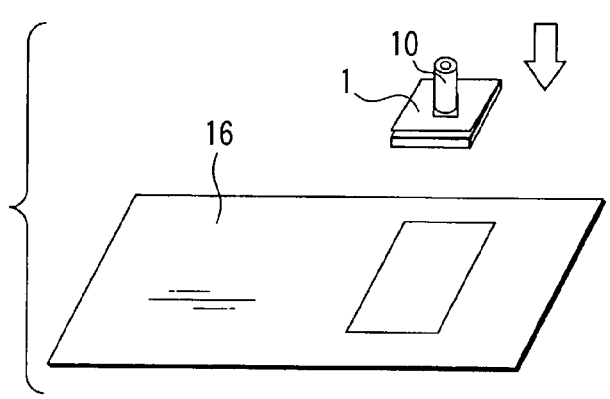
F I G. 15C

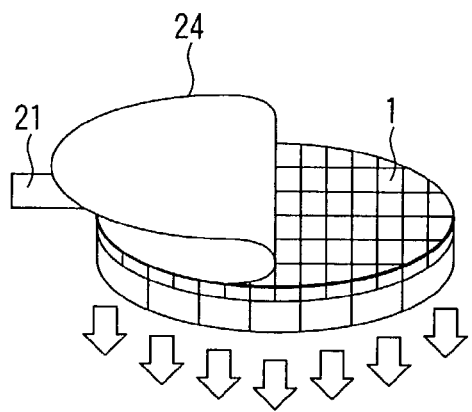
F I G. 16A
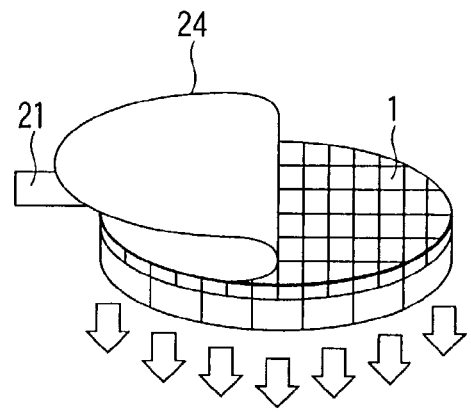
F I G. 17A
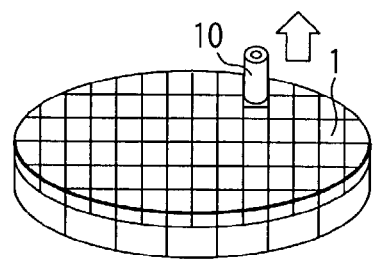
F I G. 16B
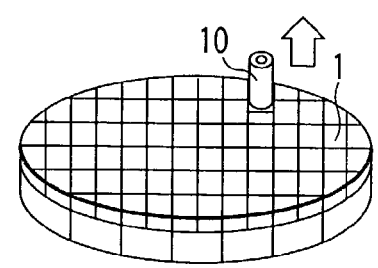
F I G. 17B
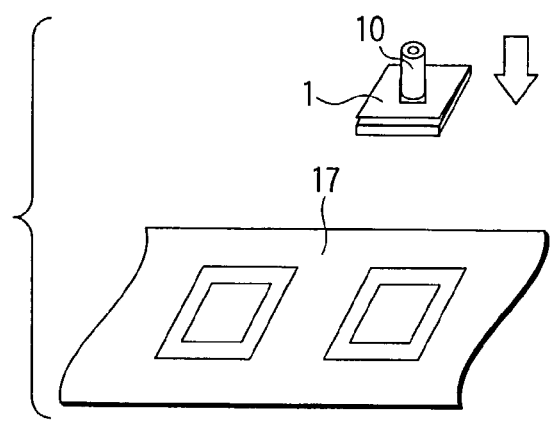
F I G. 16C
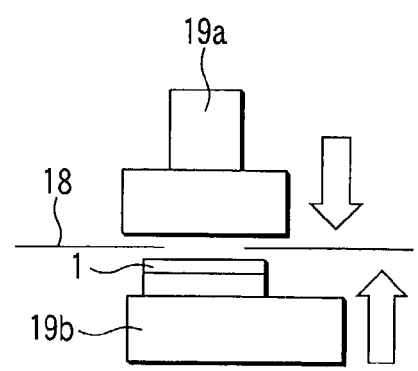
F I G. 17C

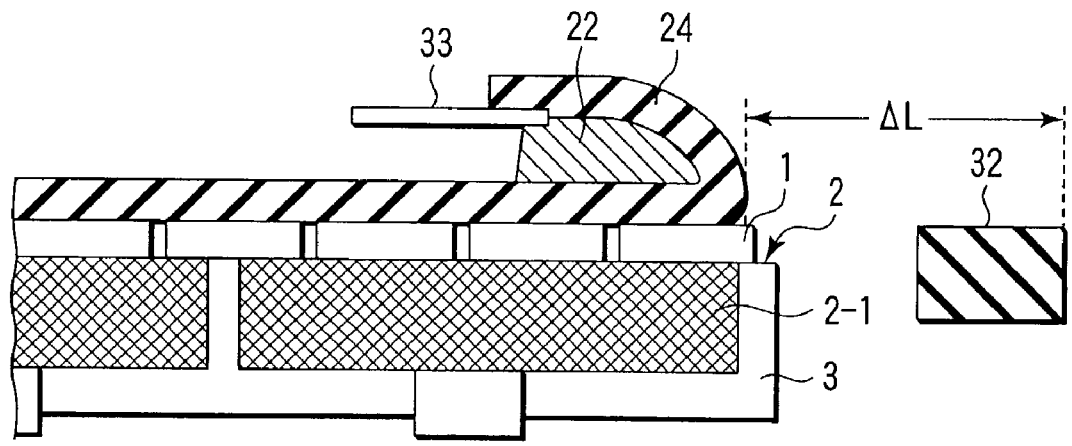
F I G. 23A
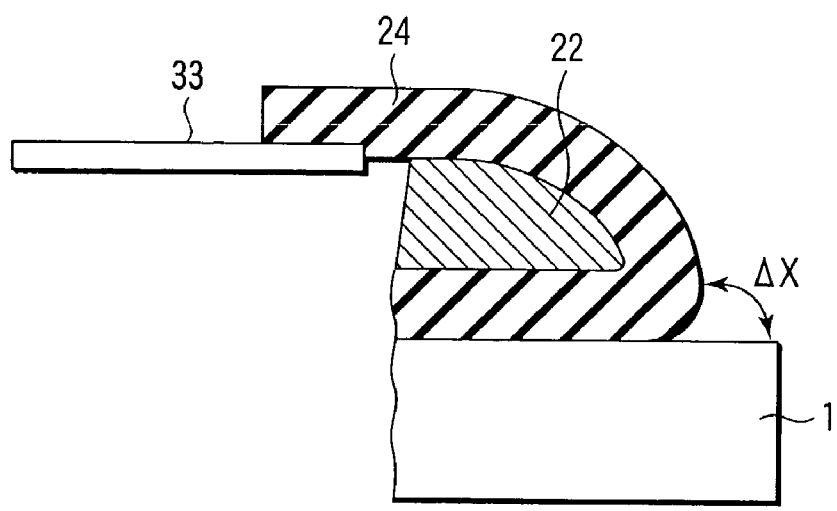
F I G. 23B

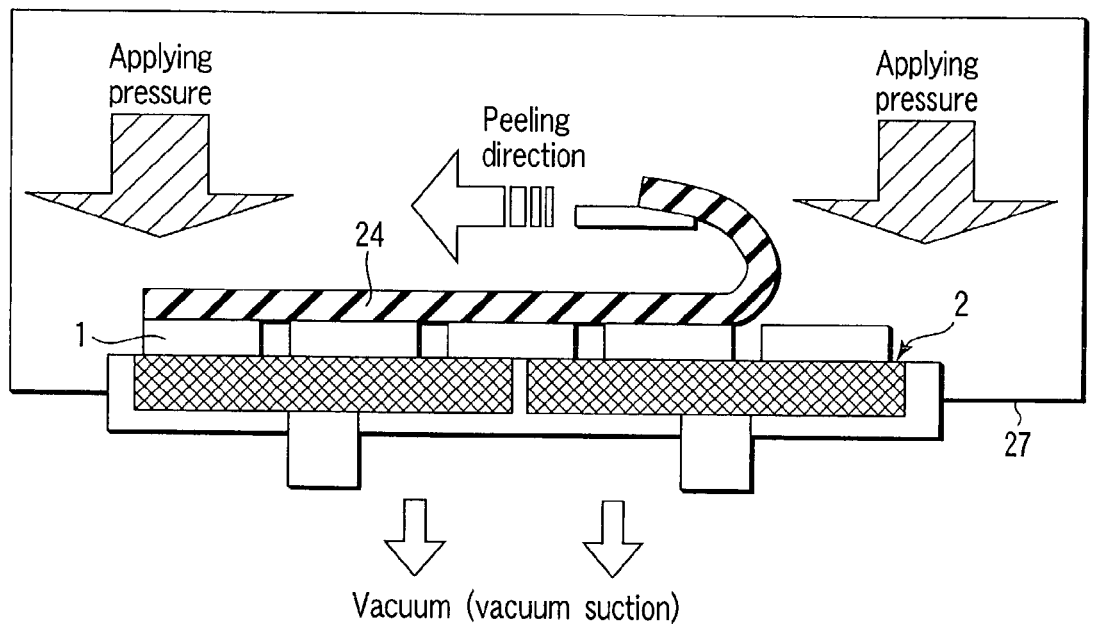
F I G. 24

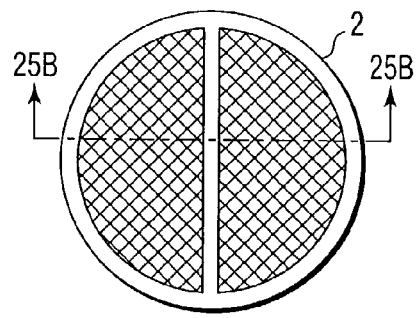
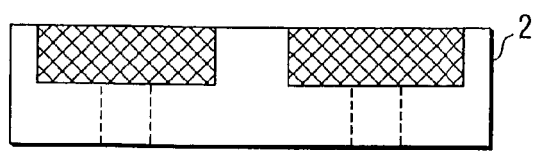
FIG. 25A  FIG. 25B
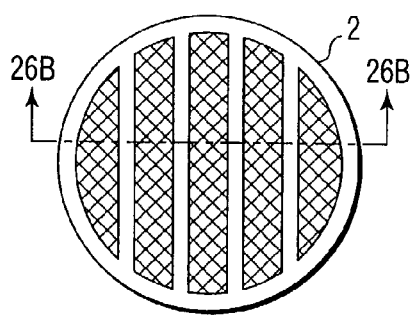
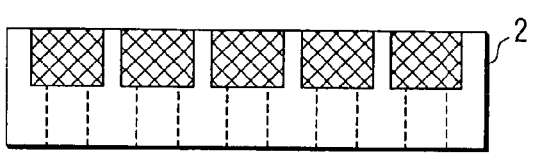
FIG. 26A  FIG. 26B
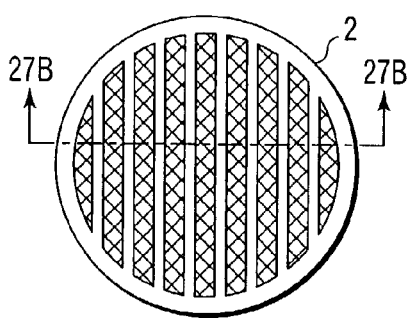
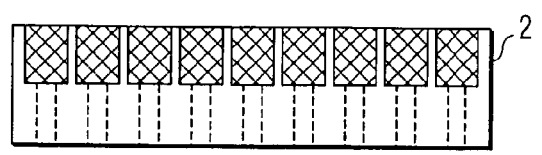
FIG. 27A  FIG. 27B

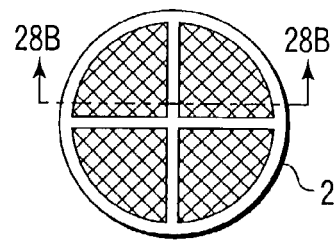 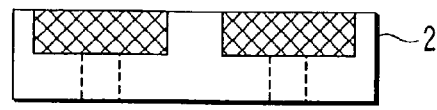
FIG. 28A  FIG. 28B
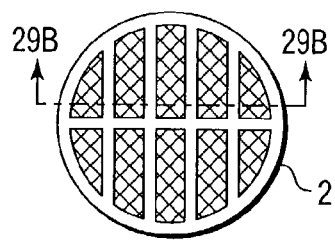 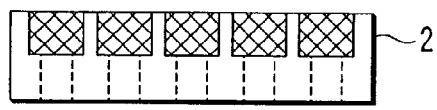
FIG. 29A  FIG. 29B
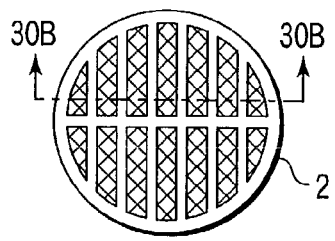 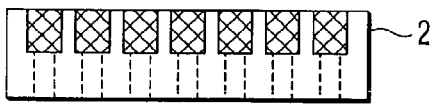
FIG. 30A  FIG. 30B
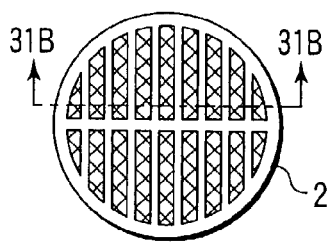 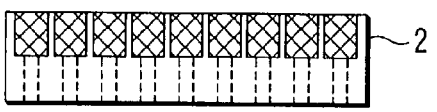
FIG. 31A  FIG. 31B

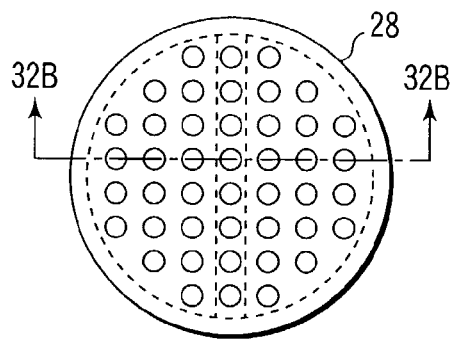 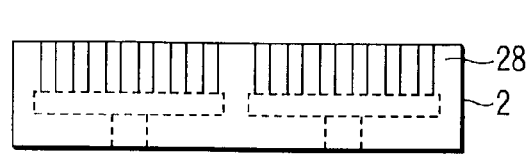
FIG. 32A   FIG. 32B
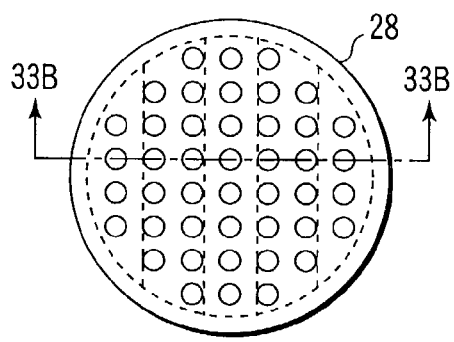 
FIG. 33A   FIG. 33B
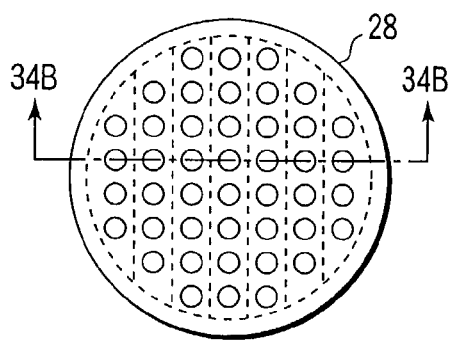 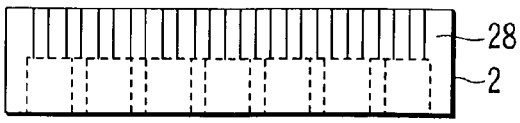
FIG. 34A   FIG. 34B

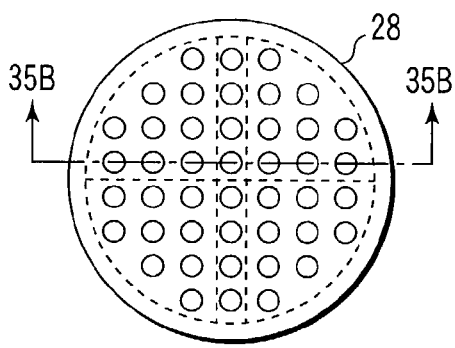 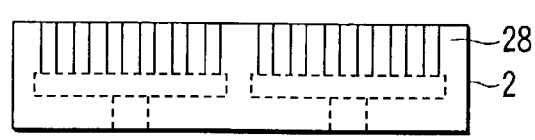
FIG. 35A          FIG. 35B
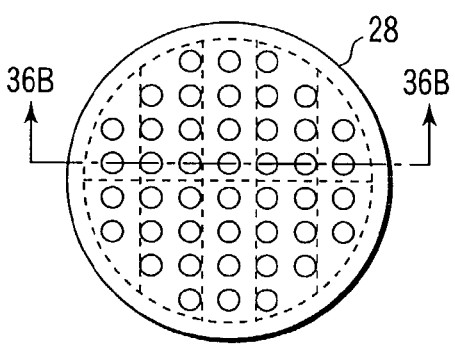 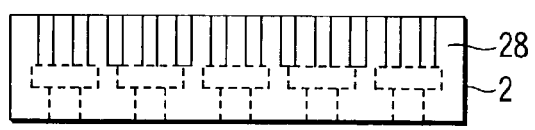
FIG. 36A          FIG. 36B
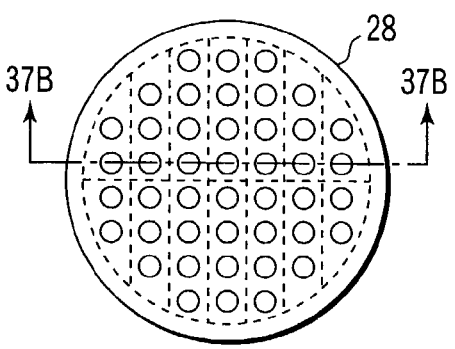 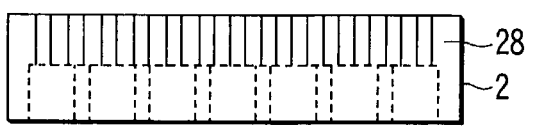
FIG. 37A          FIG. 37B

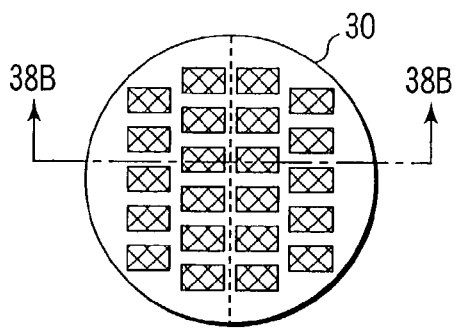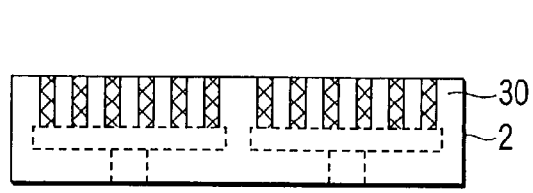
F I G. 38A              F I G. 38B
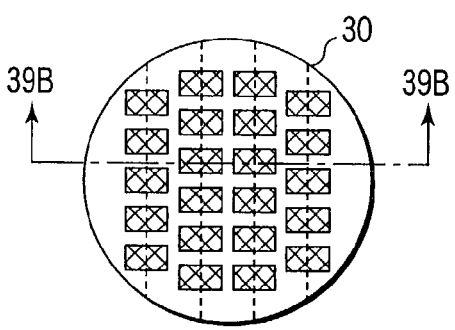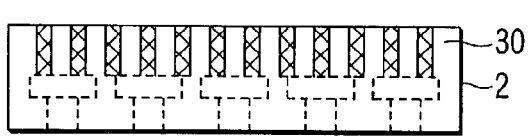
F I G. 39A              F I G. 39B
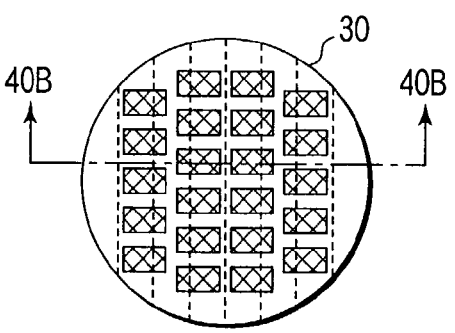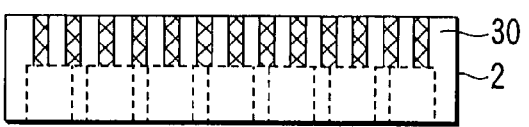
F I G. 40A              F I G. 40B

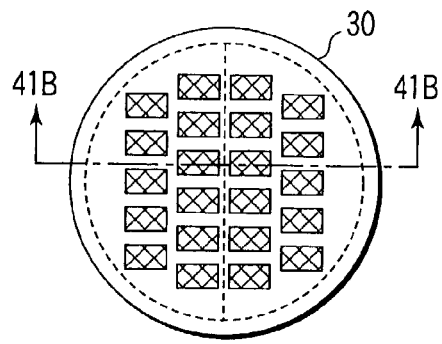
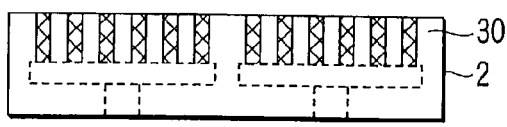
FIG. 41A          FIG. 41B
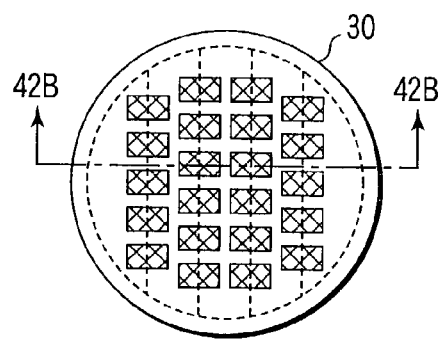
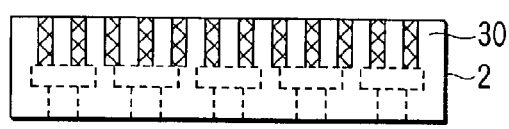
FIG. 42A          FIG. 42B
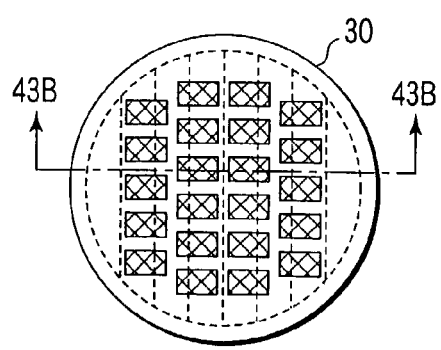
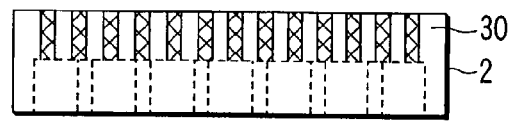
FIG. 43A          FIG. 43B

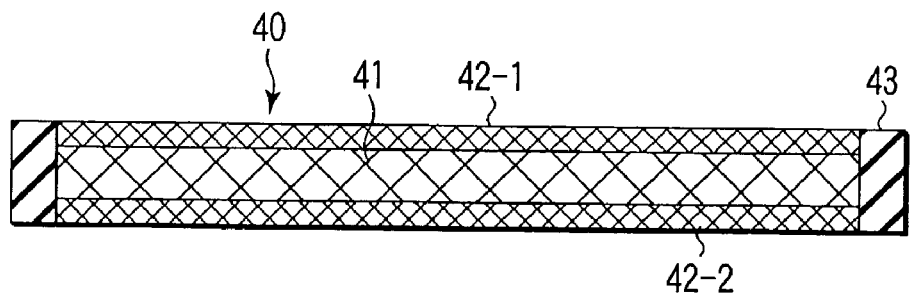
F I G. 44A
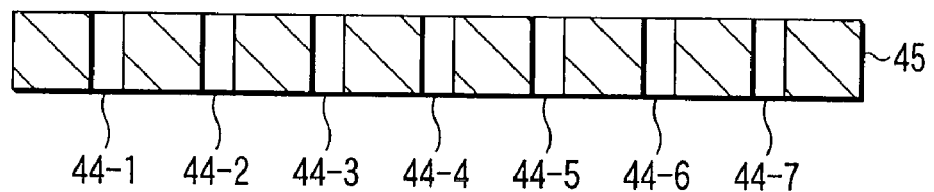
F I G. 44B
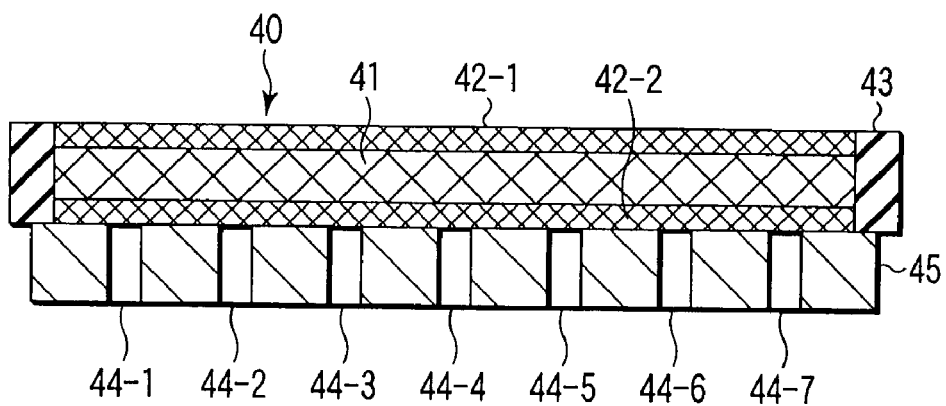
F I G. 45

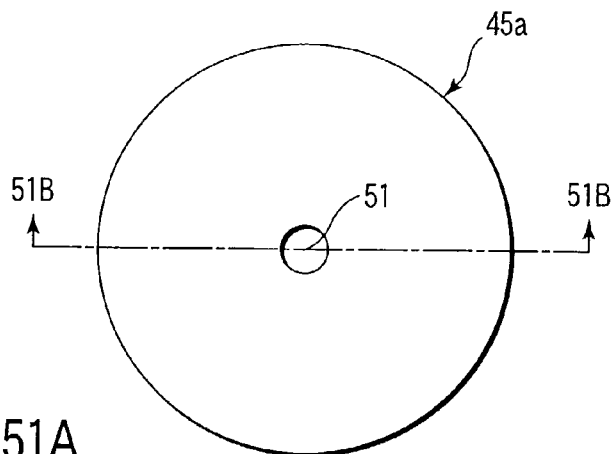
F I G. 51A
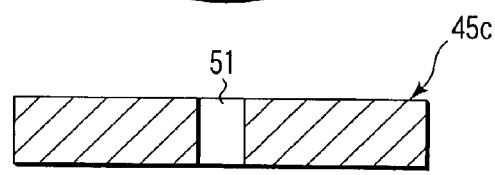
F I G. 51B
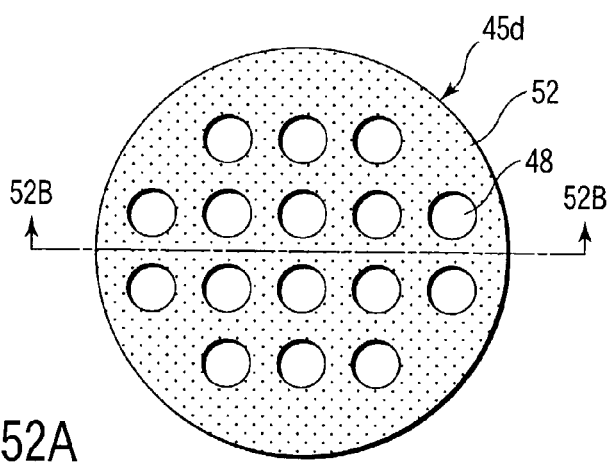
F I G. 52A
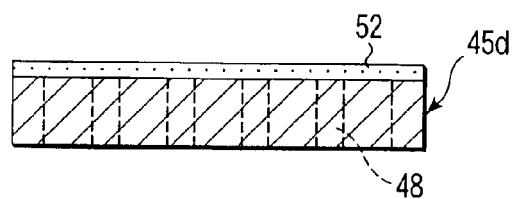
F I G. 52B

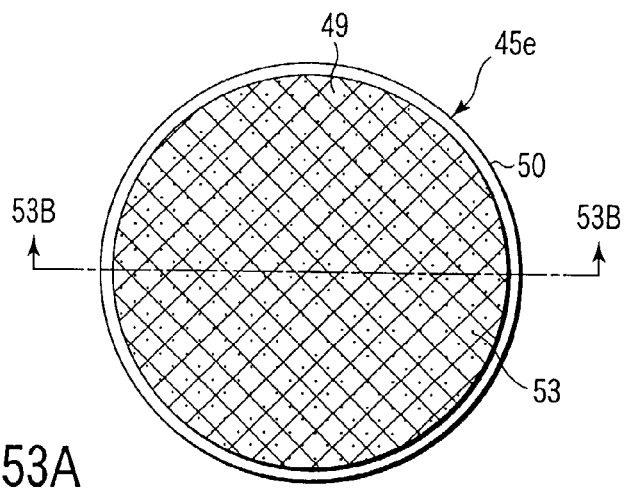
F I G. 53A
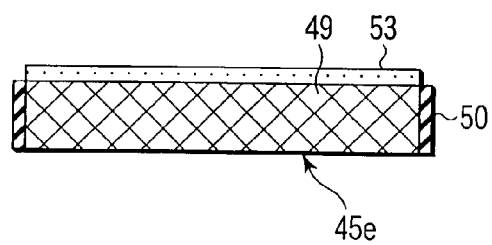
F I G. 53B
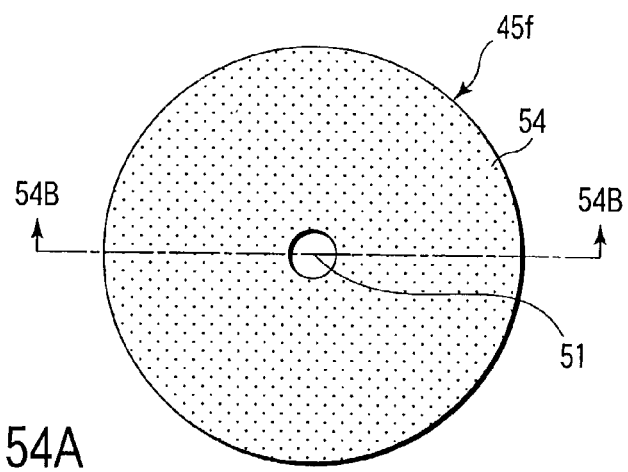
F I G. 54A
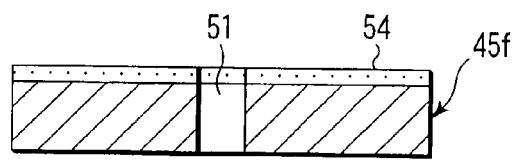
F I G. 54B

METHOD OF AND MECHANISM FOR PEELING ADHESIVE TAPE BONDED TO SEGMENTED SEMICONDUCTOR WAFER

CROSS-REFERENCE TO RELATED APPLICATIONS

This application is based upon and claims the benefit of priority from the prior Japanese Patent Applications No. 2001-298509, filed Sep. 27, 2001; and No. 2002-271536, filed Sep. 18, 2002, the entire contents of both of which are incorporated herein by reference.

BACKGROUND OF THE INVENTION

1. Field of the Invention

This invention relates to the technique for manufacturing semiconductor devices, and more particularly to a mechanism for and a method of peeling adhesive tape bonded to segmented semiconductor wafers, an apparatus for and a method of peeling adhesive tape bonded to segmented semiconductor wafers, a pickup apparatus and a pickup method which include a mechanism for peeling adhesive tape bonded to segmented semiconductor wafers and pick up each semiconductor chip, a semiconductor device manufacturing apparatus and a semiconductor device manufacturing method which include the peeling mechanism, the peeling device, or the pickup apparatus.

2. Description of the Related Art

Generally, in the processes of manufacturing semiconductor devices, a semiconductor wafer on which elements have been formed is divided into segments along dicing lines or chip division lines, thereby forming a plurality of semiconductor chips. FIGS. 1A and 1B show a state of a segmented semiconductor wafer (or semiconductor chip) 100, which is bonded to adhesive tape 101*a*. FIG. 1A is a perspective view of the wafer 100. FIG. 1B is a sectional view of the wafer 100 taken along line 1B—1B of FIG. 1A. Each semiconductor chip 100 is picked up from the adhesive tape 101*a* and undergoes the mounting processes, including the process of mounting the chip on a leadframe or TAB tape and the process of sealing the chip into a package, which completes a semiconductor device.

When each semiconductor chip 100 is picked up, the reverse of the semiconductor wafer adhering side of the adhesive tape 101*a* is bonded to another adhesive tape 101*b* adhered to a wafer ring. Then, the adhesive tape 101*a* is peeled and the wafer ring is installed on a pickup apparatus, which picks up each semiconductor chip 100.

FIG. 2 is an enlarged sectional view of the main part of the mechanism for picking up semiconductor chips 100 from the adhesive tape 101*b* in a conventional pickup apparatus. When semiconductor chips 100 are peeled from the adhesive tape 101*b* bonded to the wafer ring and picked up, thrust pins (or pick-up needles) 102 are pushed up (or raised) via the adhesive tape 101*b* from the backside of the semiconductor chip 100, thereby peeling the semiconductor chip 100 with the help of the elastic force of the adhesive tape 101*b*. The base of each thrust pin 102 is provided on a pin holder 103 in such a manner that it is located in a position corresponding to each corner or the central part of the semiconductor chip 100.

The procedure for peeling the semiconductor chips 100 from the adhesive tape 101*b* is as follows. First, a holding table on which the adhesive tape 101*b* to which the semiconductor chips 100 are bonded is fixed is moved in such a manner that a semiconductor chip 100 to be picked up is positioned above the thrust pins 102. Next, the position of the semiconductor to be peeled is sensed and a mark for determining whether the chip is good or bad is sensed. Then, a vacuum is drawn from the inside of a backup holder 104, thereby causing the adhesive tape 101*b* to adhere to the top surface of the backup holder 104 by suction and be fixed. In this state, the pin holder 103 on which the thrust pins 102 are provided is raised, thereby causing the thrust pins 102 to stick out of the top surface of the backup holder 104, with the result that the thrust pins push up the semiconductor chip 100 from the backside via the adhesive tape 101*b*.

In recent years, to incorporate semiconductor chips into, for example, a card-like thin package, there have been strong demands toward making semiconductor chips thinner. The backside of a semiconductor wafer is polished, grounded, and etched to a thickness of 100 μm or less. However, when a semiconductor chip is made as thin as 100 μm or less, the chip cracks, or cracks occur, at the time of bonding the chip to another adhesive tape, which decreases the manufacturing yield. That is, after the semiconductor chips 100 bonded to the adhesive tape 101*a* are bonded to another adhesive tape 101*b* bonded to the wafer ring, cracks take place in the semiconductor chips at the time of peeling the adhesive tape 101*a*. When the semiconductor chips are bonded to another adhesive tape, there arises another problem: the semiconductor chips 100 touch each other, permitting them to chip, which degrades the quality of the semiconductor devices.

When each semiconductor chip is picked up, cracks or chipping also occurs. The crack problem arising at the time of picking up each semiconductor chip with a thickness of 100 μm or less will be explained in further detail by reference to FIGS. 3A, 3B, 4A and 4B. In the case where a semiconductor chip is very thin as described above, even when the periphery of the semiconductor chip 100 (particularly its corners) has come off, the semiconductor chip 100 warps concavely before peeling as shown in FIG. 3A because the speed at which the adhesive tape 101*b* peels is slower than the speed at which the thrust pins 102 go up, with the result that cracks take place as shown in FIG. 3B. Alternatively, as shown in FIGS. 4A and 4B, when the backside of a semiconductor chip 100 is pushed up by the thrust pins 102, with the adhesive tape 101*b* intervening between them, cracks occur in the part where the semiconductor chip 100 and the thrust pins 102 are in contact with each other in a state where only the corners are peeled, or the thrust pins 102 penetrate, with the result that the chip cracks. When the thickness of the semiconductor chip is 100 μm or more, such a phenomenon is less liable to take place because the strength (in the direction of thickness) of the semiconductor chip is great on account of the adhesion of the adhesive tape 101*b* to the semiconductor chip 100.

As described above, when a semiconductor chip is made thinner, the resistance of the semiconductor chip to breaking decreases, with the result that a decrease in the quality due to cracks or chipping and a drop in the yield cannot be avoided by a conventional mechanism for and method of peeling adhesive tape and by a conventional apparatus for and method of picking up semiconductor chips. Therefore, there have been demands for improvements in not only that mechanism, apparatus, and method but also an apparatus for and a method of manufacturing semiconductor devices which include the mechanism, apparatus, and method.

BRIEF SUMMARY OF THE INVENTION

According to an aspect of the present invention, there is provided an adhesive tape peeling mechanism comprising:

an adhering section which adheres by suction to a segmented semiconductor wafer bonded to adhesive tape; and a porous member which is provided on the surface adhering to the segmented semiconductor wafer of the adhering section and is divided into at least two adhering areas in the direction in which adhesive tape is peeled and which adheres to the segmented semiconductor wafer by suction and fixes the segmented semiconductor wafer in place.

According to another aspect of the present invention, there is provided a method of peeling adhesive tape from a segmented semiconductor wafer, comprising: attracting the semiconductor wafer to the segmented semiconductor wafer by suction through a porous member having at least two suction areas arranged in a direction of peeling the adhesive tape and through at least two suction paths open to each of the at least two suction areas, such that the at least two suction paths are switched from one to another every time peeling of the adhesive tape proceeds to a position near one suction area.

According to still another aspect of the present invention, there is provided a apparatus for peeling adhesive tape bonded to a segmented semiconductor wafer, comprising: a holding table which includes a wafer adhering section having a porous member divided into at least two adhering areas in the direction in which adhesive tape is peeled and which adheres by suction to the segmented semiconductor wafer bonded to adhesive tape and fixes the segmented semiconductor wafer in place; a peeling claw which pulls one end of the adhesive tape and peels the tape; a first suction device which adheres to the segmented semiconductor wafer by suction through a first suction path provided so as to correspond to each adhering area of the wafer adhering section; a second suction device which adheres to the segmented semiconductor wafer by suction through a second suction path provided so as to correspond to each adhering area of the wafer adhering section; and a switching unit which switches between the suction of the segmented semiconductor wafer by the first suction device and the suction of the segmented semiconductor wafer by the second suction device on a suction path basis, wherein one end of the adhesive tape is pulled and peeled with the peeling claw, while the first suction device is adhering to the segmented semiconductor wafer by suction through the first suction path, the switching unit changes the switching paths when a part of the adhesive tape near the adjacent adhering areas of the wafer adhering section is peeled, and the second suction path of the second suction device corresponding to the adhering area adheres the segmented semiconductor wafer by suction.

According to still another aspect of the present invention, there is provided method of peeling adhesive tape bonded to a segmented semiconductor wafer, comprising: placing the segmented semiconductor wafer bonded to adhesive tape on a holding table which has a wafer adhering section having a porous member divided into at least two adhering areas in the direction in which the adhesive tape is peeled; adhering the segmented semiconductor wafer by suction through a first suction path provided so as to correspond to each adhering area; pulling one end of the adhesive tape and peeling the adhesive tape; and adhering the segmented semiconductor wafer by suction through a second suction path different from the first suction path, when a part of the adhesive tape near the adjacent adhering areas of the wafer adhering section is peeled.

According to still another aspect of the present invention, there is provided a pickup apparatus which has a peeling mechanism for peeling adhesive tape bonded to a segmented semiconductor wafer and picks up each semiconductor chip, the pickup apparatus comprising: a holding table which includes a wafer adhering section having a porous member divided into at least two adhering areas in the direction in which adhesive tape is peeled and which adheres by suction to the segmented semiconductor wafer bonded to adhesive tape and fixes the segmented semiconductor wafer in place; a peeling claw which pulls one end of the adhesive tape and peels the adhesive tape; a first suction device which adheres to the segmented semiconductor wafer by suction through a first suction path provided so as to correspond to each adhering area of the wafer adhering section; a second suction device which adheres to the segmented semiconductor wafer by suction through a second suction path provided so as to correspond to each adhering area of the wafer adhering section; a switching unit which switches between the suction of the semiconductor wafer by the first suction device and the suction of the segmented semiconductor wafer by the second suction device on a suction path basis, and a suction collet which adheres to each semiconductor chip by suction and picks up the semiconductor chip, wherein one end of the adhesive tape is pulled and peeled with the peeling claw, while the first suction device is adhering to the segmented semiconductor wafer by suction through the first suction path, the switching unit changes the switching paths when a part of the adhesive tape near the adjacent adhering areas of the wafer adhering section is peeled, the second suction path corresponding to the adhering area of the second suction device adheres to the segmented semiconductor wafer by suction, and the suction collet adheres to each semiconductor chip by suction and picks up the semiconductor chip after the peeling of the adhesive tape is completed.

According to still another aspect of the present invention, there is provided a method of picking up each semiconductor chip after peeling adhesive tape bonded to a segmented semiconductor wafer, the method comprising: causing a first suction path provided so as to correspond to at least two adhering areas into which a porous member is divided in the direction in which adhesive tape is peeled to adhere to the segmented semiconductor wafer bonded to adhesive tape and fix the segmented semiconductor wafer in place; pulling one end of the adhesive tape and peeling the adhesive tape; causing a second suction path corresponding to the adhering areas to adhere the segmented semiconductor wafer when the adhesive tape near the adjacent adhering areas is peeled; and causing the suction collet to adhere to each semiconductor chip by suction and pick up the semiconductor chip after the peeling of the adhesive tape is completed.

According to still another aspect of the present invention, there is provided a method of manufacturing a semiconductor device: forming elements at the surface of a semiconductor wafer; dividing the element formation completed semiconductor wafer along dicing lines or chip division lines to form segmented semiconductor wafer; placing a segmented semiconductor wafer bonded to adhesive tape on a holding table that has a wafer adhering section having a porous member divided into at least two adhering areas in the direction in which adhesive tape is peeled; causing a first suction path provided so as to correspond to the adhering areas to adhere to the wafer by suction and fix the wafer in place; pulling one end of the adhesive tape and peeling the adhesive tape; switching to a second suction path corresponding to the adhering areas and adhering to the semiconductor wafer by suction and fixing the wafer in place, when a part of the adhesive tape near the adjacent adhering areas is peeled; relatively moving the holding table and a suction collet after the peeling of the adhesive tape is completed and thereby moving the suction collet to above a semiconductor chip to be picked up; and causing the suction collet to adhere to each of the semiconductor chips by suction and pick up the semiconductor chip.

BRIEF DESCRIPTION OF THE SEVERAL
VIEWS OF THE DRAWING

FIG. 1A is a perspective view showing a state of a segmented semiconductor wafer (or semiconductor chip) to help explain the processes of manufacturing conventional semiconductor devices;

FIG. 1B is a sectional view taken along line 1B—1B of FIG. 1, showing a state of a segmented semiconductor wafer (or semiconductor chip) to help explain the processes of manufacturing conventional semiconductor devices;

FIG. 2 is an enlarged sectional view of the main part of the mechanism for picking up a semiconductor chip from adhesive tape in a conventional pickup apparatus;

FIG. 3A is a sectional view to help explain cracks occurring when the thickness of a semiconductor chip is 100 µm or less;

FIG. 3B is a plan view which shows a state where a semiconductor chip peels and which helps explain cracks occurring when the thickness of the semiconductor chip is 100 µm or less;

FIG. 4A is a sectional view to help explain cracks occurring due to another cause when the thickness of a semiconductor chip is 100 µm or less;

FIG. 4B is a plan view which shows a state where a semiconductor chip peels and which helps explain cracks occurring due to another cause when the thickness of the semiconductor chip is 100 µm or less;

FIG. 12A is a perspective view which shows the process of peeling adhesive tape and which helps explain the process of mounting picked-up semiconductor chips;

FIG. 12B is a perspective view which shows a pickup process and which helps explain the process of mounting picked-up semiconductor chips;

FIG. 12C is a perspective view which shows a mounting process and which helps explain the process of mounting picked-up semiconductor chips;

FIG. 14A is a perspective view to help explain a picker and an adhesive tape peeling process;

FIG. 14B is a perspective view to help explain the picker and a pickup process;

FIG. 14C is a perspective view to help explain the picker and a tray packaging process;

FIG. 15A is a perspective view to help explain a flip chip bonder and an adhesive tape peeling process;

FIG. 15B is a perspective view to help explain the flip chip bonder and a pickup process;

FIG. 15C is a perspective view to help explain the flip chip bonder and a flip chip connecting process;

FIG. 16A is a perspective view to help explain a film adhesive bonder and an adhesive tape peeling process;

FIG. 16B is a perspective view to help explain the film adhesive bonder and a pickup process;

FIG. 16C is a perspective view to help explain the film adhesive bonder and a mounting process;

FIG. 17A is a perspective view to help explain an inner lead bonder and an adhesive tape peeling process;

FIG. 17B is a perspective view to help explain the inner lead bonder and a pickup process;

FIG. 17C is a perspective view to help explain the inner lead bonder and a mounting process;

FIGS. 23A and 23B are enlarged sectional views circumferential part of place in the semiconductor chips at the time of peeling the adhesive tape;

FIG. 24 is a sectional view which helps explain a fourth embodiment of the present invention and which shows a schematic configuration;

FIG. 25A is a top view showing another configuration of the wafer adhering section applied to the first to fourth embodiments;

FIG. 25B is a sectional view which is taken along line 25B—25B of FIG. 25A and which shows another configuration of the wafer adhering section applied to the first to fourth embodiments;

FIG. 26A is a top view showing still another configuration of the wafer adhering section applied to the first to fourth embodiments;

FIG. 26B is a sectional view which is taken along line 26B—26B of FIG. 26A and which shows still another configuration of the wafer adhering section applied to the first to fourth embodiments;

FIG. 27A is a top view showing another configuration of the wafer adhering section applied to the first to fourth embodiments;

FIG. 27B is a sectional view which is taken along line 27B—27B of FIG. 27A and which shows another configuration of the wafer adhering section applied to the first to fourth embodiments;

FIG. 28A is a top view showing still another configuration of the wafer adhering section applied to the first to fourth embodiments;

FIG. 28B is a sectional view which is taken along line 28B—28B of FIG. 28A and which shows still another configuration of the wafer adhering section applied to the first to fourth embodiments;

FIG. 29A is a top view showing another configuration of the wafer adhering section applied to the first to fourth embodiments;

FIG. 29B is a sectional view which is taken along line 29B—29B of FIG. 29A and which shows another configuration of the wafer adhering section applied to the first to fourth embodiments;

FIG. 30A is a top view showing still another configuration of the wafer adhering section applied to the first to fourth embodiments;

FIG. 30B is a sectional view which is taken along line 30B—30B of FIG. 30A and which shows still another configuration of the wafer adhering section applied to the first to fourth embodiments;

FIG. 31A is a top view showing another configuration of the wafer adhering section applied to the first to fourth embodiments;

FIG. 31B is a sectional view which is taken along line 31B—31B of FIG. 31A and which shows another configuration of the wafer adhering section applied to the first to fourth embodiments;

FIG. 32A is a top view showing still another configuration of the wafer adhering section applied to the first to fourth embodiments;

FIG. 32B is a sectional view which is taken along line 32B—32B of FIG. 32A and which shows still another configuration of the wafer adhering section applied to the first to fourth embodiments;

FIG. 33A is a top view showing another configuration of the wafer adhering section applied to the first to fourth embodiments;

FIG. 33B is a sectional view which is taken along line 33B—33B of FIG. 33A and which shows another configuration of the wafer adhering section applied to the first to fourth embodiments;

FIG. 34A is a top view showing still another configuration of the wafer adhering section applied to the first to fourth embodiments;

FIG. 34B is a sectional view which is taken along line 34B—34B of FIG. 34A and which shows still another configuration of the wafer adhering section applied to the first to fourth embodiments;

FIG. 35A is a top view showing another configuration of the wafer adhering section applied to the first to fourth embodiments;

FIG. 35B is a sectional view which is taken along line 35B—35B of FIG. 35A and which shows another configuration of the wafer adhering section applied to the first to fourth embodiments;

FIG. 36A is a top view showing still another configuration of the wafer adhering section applied to the first to fourth embodiments;

FIG. 36B is a sectional view which is taken along line 36B—36B of FIG. 36A and which shows still another configuration of the wafer adhering section applied to the first to fourth embodiments;

FIG. 37A is a top view showing another configuration of the wafer adhering section applied to the first to fourth embodiments;

FIG. 37B is a sectional view which is taken along line 37B—37B of FIG. 37A and which shows another configuration of the wafer adhering section applied to the first to fourth embodiments;

FIG. 38A is a top view showing still another configuration of the wafer adhering section applied to the first to fourth embodiments;

FIG. 38B is a sectional view which is taken along line 38B—38B of FIG. 38A and which shows still another configuration of the wafer adhering section applied to the first to fourth embodiments;

FIG. 39A is a top view showing another configuration of the wafer adhering section applied to the first to fourth embodiments;

FIG. 39B is a sectional view which is taken along line 39B—39B of FIG. 39A and which shows still another configuration of the wafer adhering section applied to the first to fourth embodiments;

FIG. 40A is a top view showing still another configuration of the wafer adhering section applied to the first to fourth embodiments;

FIG. 40B is a sectional view which is taken along line 40B—40B of FIG. 40A and which shows still another configuration of the wafer adhering section applied to the first to fourth embodiments;

FIG. 41A is a top view showing another configuration of the wafer adhering section applied to the first to fourth embodiments;

FIG. 41B is a sectional view which is taken along line 41B—41B of FIG. 41A and which shows another configuration of the wafer adhering section applied to the first to fourth embodiments;

FIG. 42A is a top view showing still another configuration of the wafer adhering section applied to the first to fourth embodiments;

FIG. 42B is a sectional view which is taken along line 42B—42B of FIG. 42A and which shows still another configuration of the wafer adhering section applied to the first to fourth embodiments;

FIG. 43A is a top view showing another configuration of the wafer adhering section applied to the first to fourth embodiments;

FIG. 43B is a sectional view which is taken along line 43B—43B of FIG. 43A and which shows another configuration of the wafer adhering section applied to the first to fourth embodiments;

FIG. 44A is a sectional view of porous adhesive tape to help explain another configuration of the wafer adhering section applied to the first to fourth embodiments;

FIG. 44B is a sectional view of a support member to help explain another configuration of the wafer adhering section applied to the first to fourth embodiments;

FIG. 45 is a sectional view which shows a state where the support member is stuck to porous adhesive tape and which helps to explain another configuration of the wafer adhering section applied to the first to fourth embodiments;

FIG. 51A is a plan view to help explain another more concrete configuration of the support member;

FIG. 51B is a sectional view taken along line 51B—51B of FIG. 51A to help explain the one other more concrete configuration of the support member;

FIG. 52A is a plan view to help explain still another more concrete configuration of the support member;

FIG. 52B is a sectional view taken along line 52B—52B of FIG. 52A to help explain the one other more concrete configuration of the support member;

FIG. 53A is a plan view to help explain another more concrete configuration of the support member;

FIG. 53B is a sectional view taken along line 53B—53B of FIG. 53A to help explain the one other more concrete configuration of the support member;

FIG. 54A is a plan view to help explain still another more concrete configuration of the support member;

FIG. 54B is a sectional view taken along line 54B—54B of FIG. 54A to help explain the one other more concrete configuration of the support member.

DETAILED DESCRIPTION OF THE INVENTION

Figure 5:
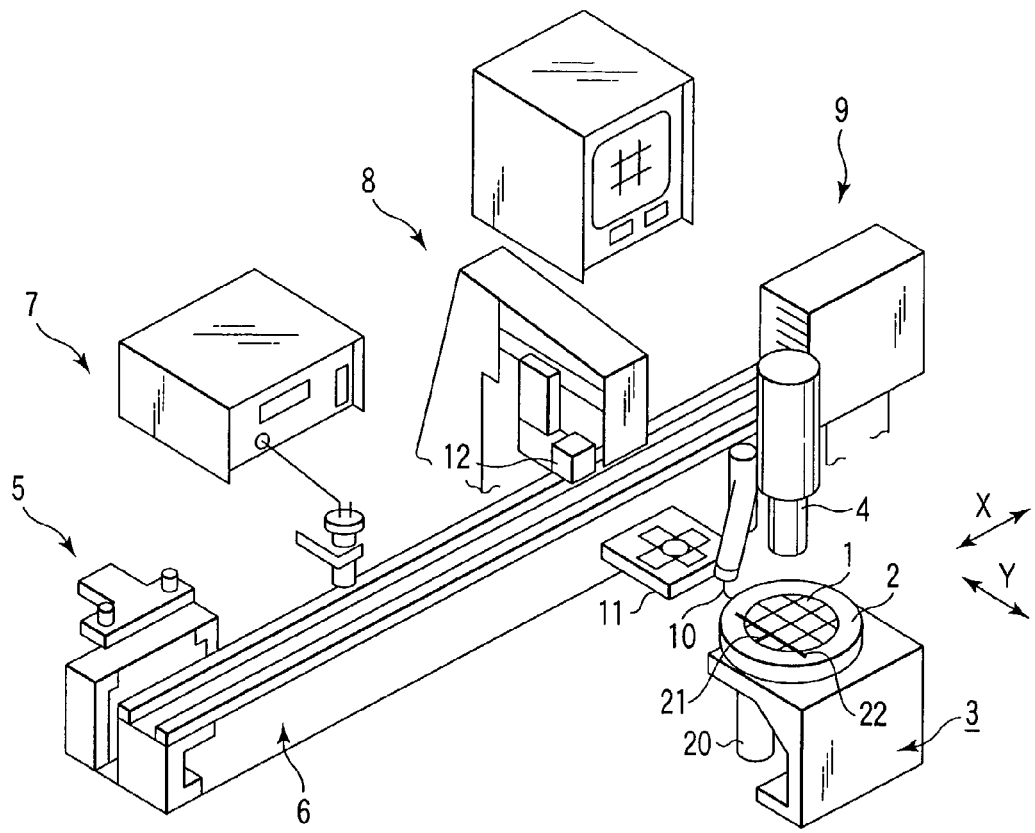
FIG. 5 is a perspective view showing a schematic configuration of a die bonder according to a first embodiment of the present invention.
Figure 6A:
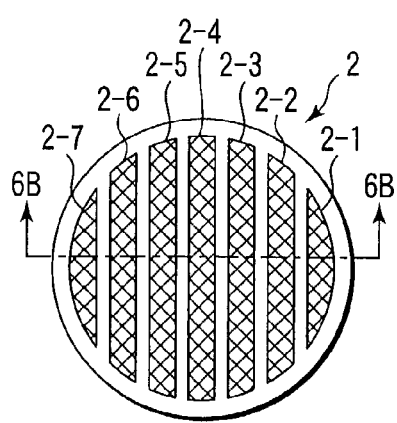
FIG. 6A is a top view to help explain the configuration of a wafer adhering section used in a peeling mechanism and a pickup mechanism.
Figure 6B:
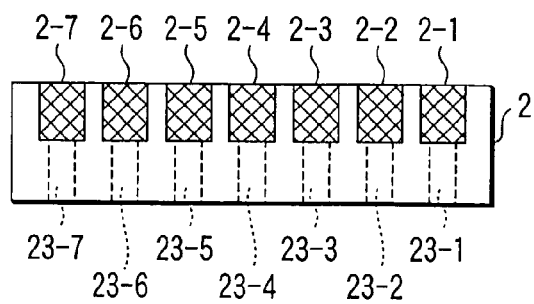
FIG. 6B is a sectional view which is taken along line 6B—6B of FIG. 6A and which helps explain the configuration of the wafer adhering section used in the peeling mechanism and pickup mechanism.
Figure 7A:
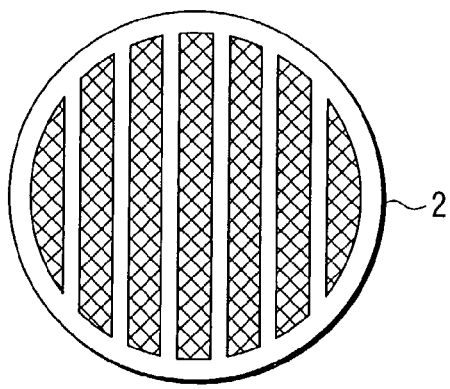
FIG. 7A is a top view of the wafer adhering section to help explain the wafer adhering section and the arrangement of segmented semiconductor wafers.
Figure 7B:
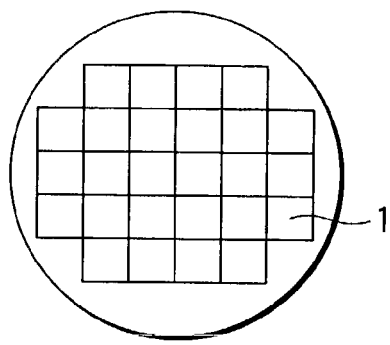
FIG. 7B is a plan view which shows an example of the arrangement of segmented semiconductor wafers and which helps explain the wafer adhering section and the arrangement of segmented semiconductor wafers.
Figure 7C:
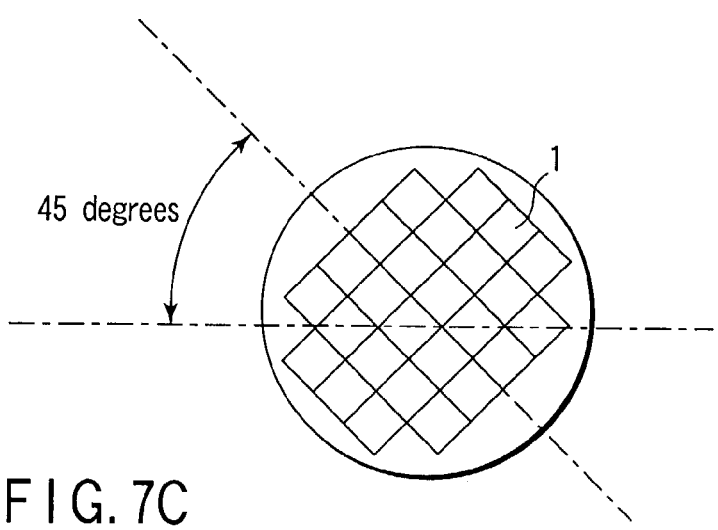
FIG. 7C is a plan view which shows another example of the arrangement of segmented semiconductor wafers and which helps explain the wafer adhering section and the arrangement of segmented semiconductor wafers.
Figure 8:
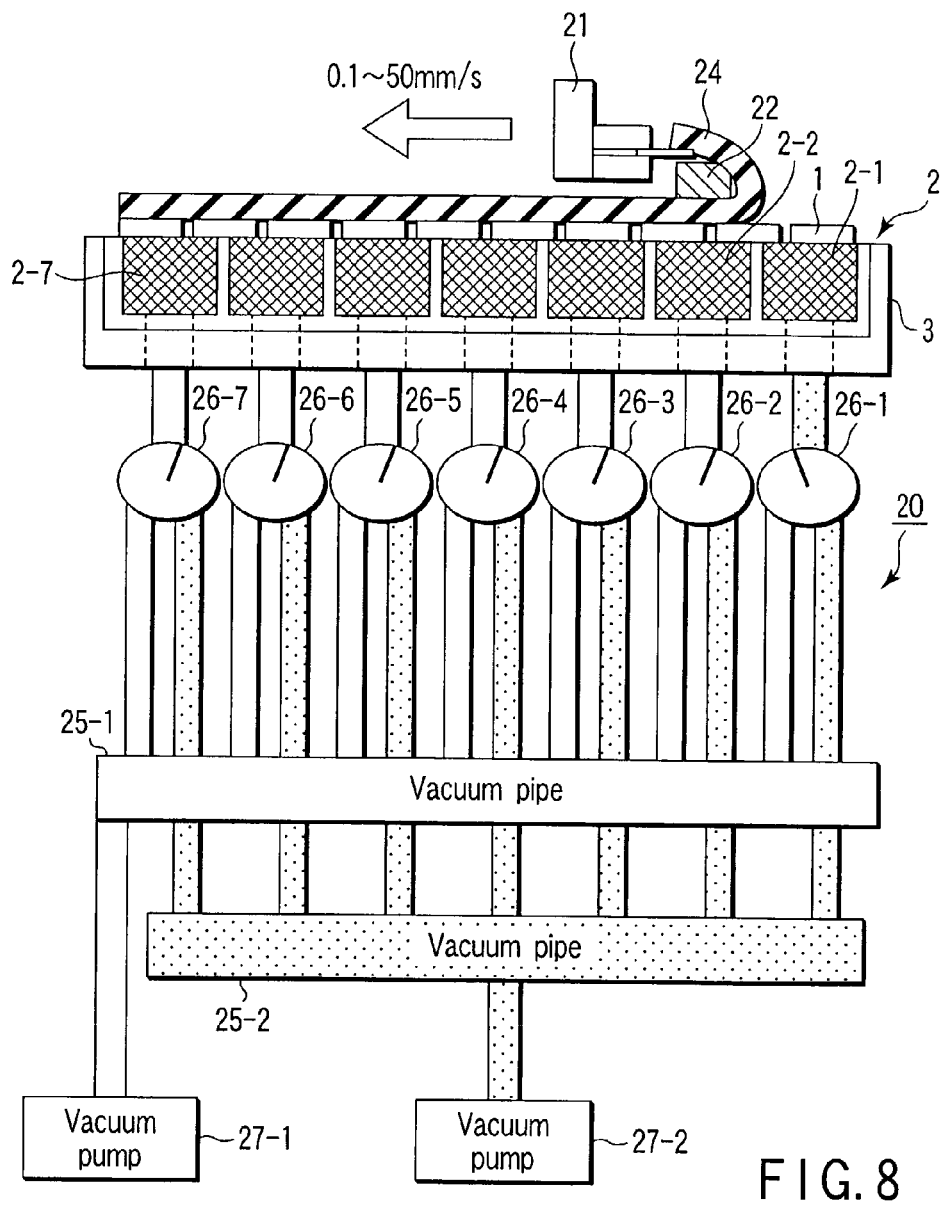
FIG. 8 is a sectional view to help explain the mechanism for peeling adhesive tape in a die bonder.
Figure 9A:
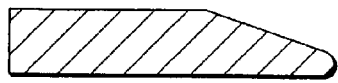
FIG. 9A is a sectional view to help explain an example of the configuration of an auxiliary plate.
Figure 9B:
FIG. 9B is a sectional view to help explain another example of the configuration of the auxiliary plate.
Figure 10:
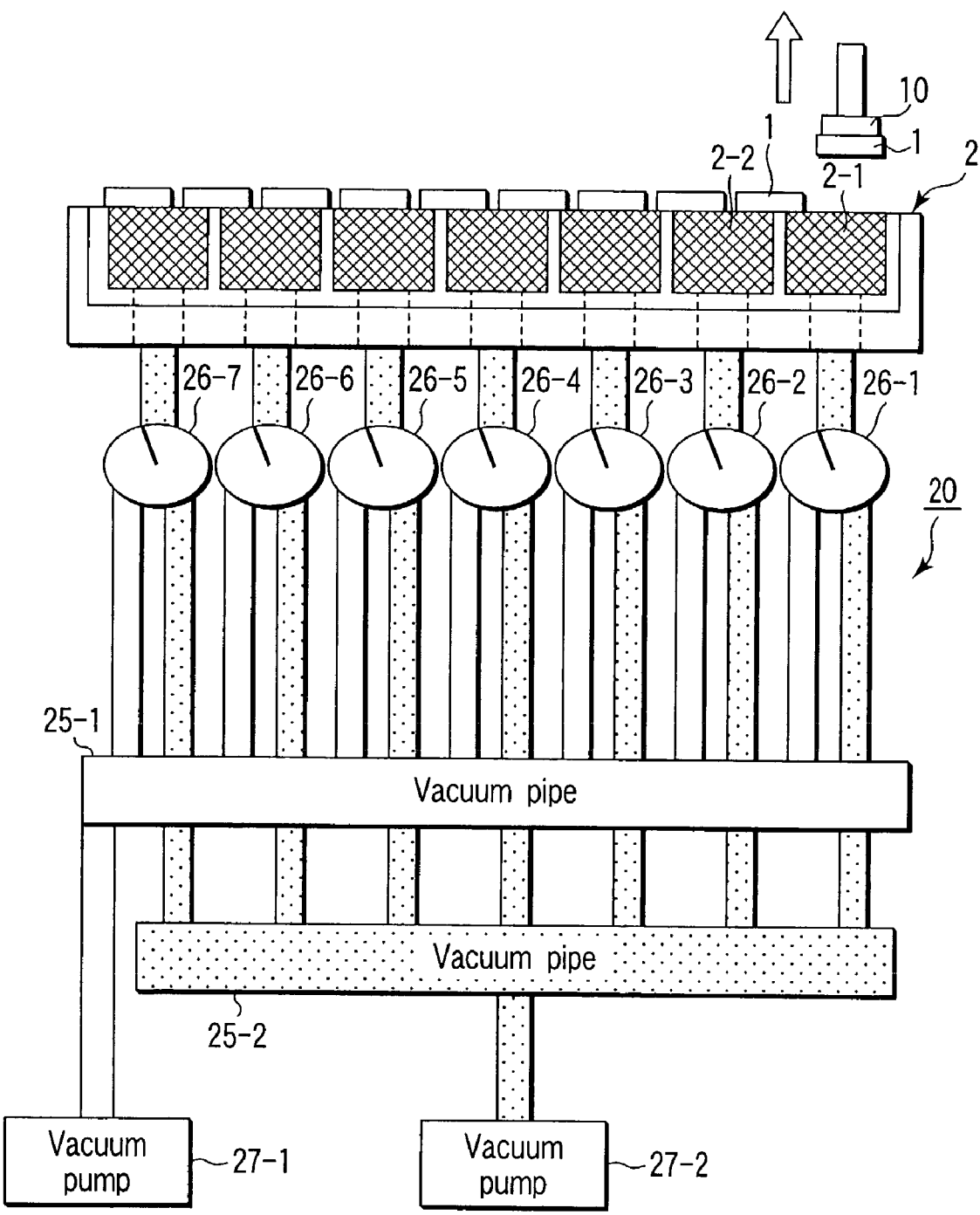
FIG. 10 is a sectional view to help explain the pickup mechanism for semiconductor chips in the die bonder.
Figure 11:
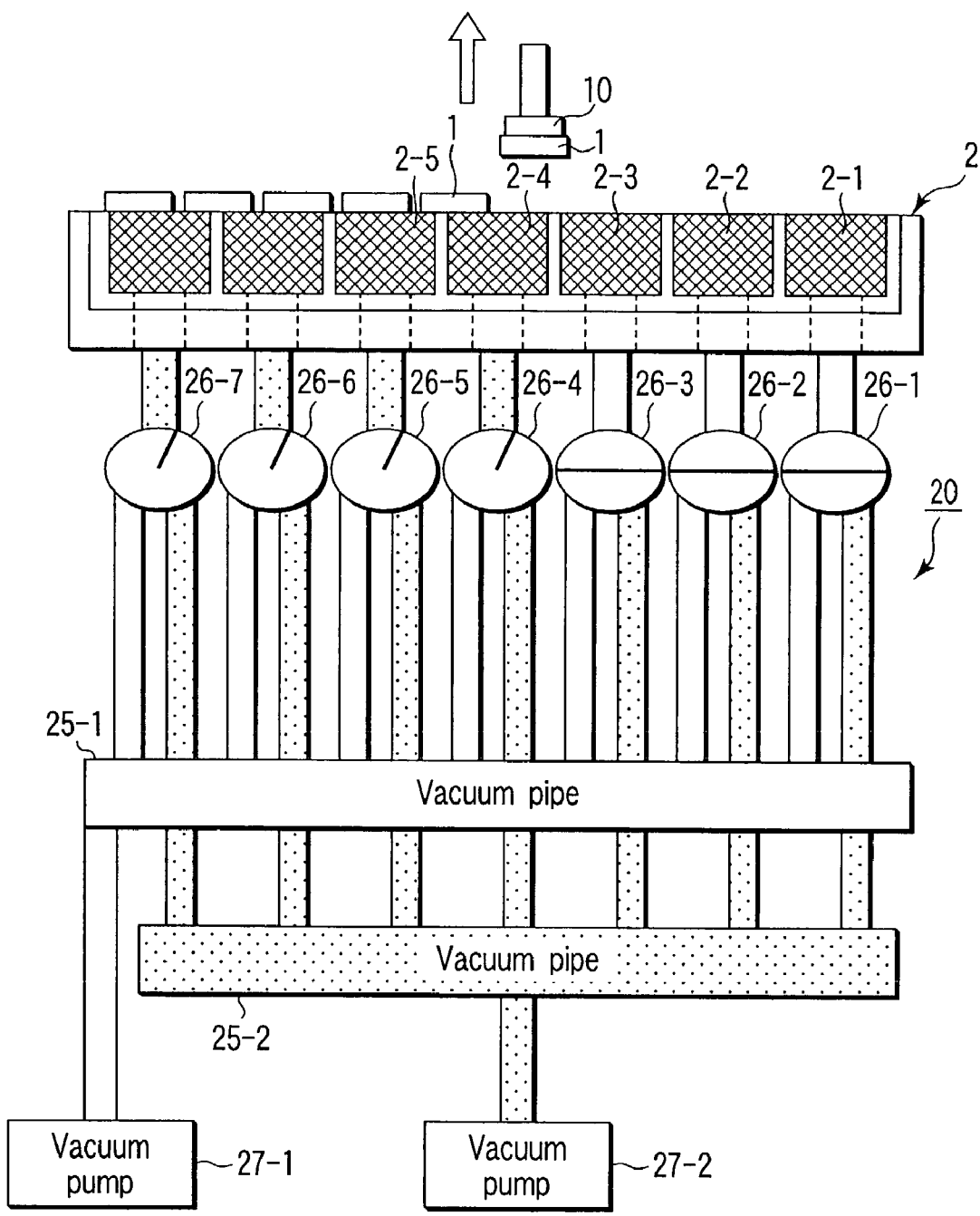
FIG. 11 is a sectional view to help explain another example of the configuration of the pickup mechanism for semiconductor chips in the die bonder.
Figure 13:
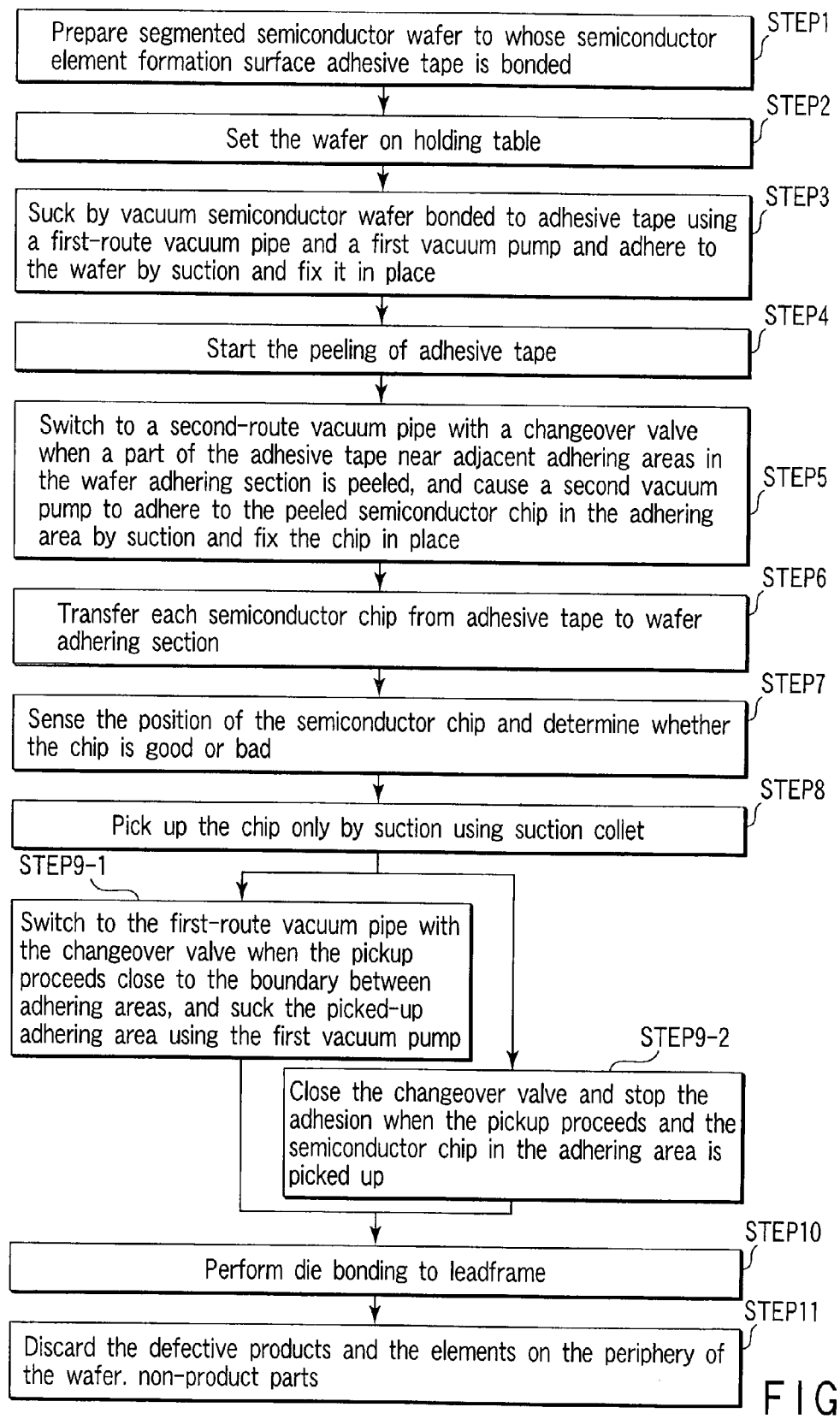
FIG. 13 is a flowchart for a die bonding process in the die bonder.

FIGS. 5, 6A, 6B, 7A to 7C, 8, 9A, 9B, 10, 11, 12A to 12C and 13 help explain an adhesive tape peeling mechanism, an adhesive tape peeling apparatus, an adhesive tape peeling method, a semiconductor chip pickup apparatus, a semiconductor chip pickup method, a semiconductor device manufacturing method, and a semiconductor device manufacturing apparatus which are related to a first embodiment of the present invention. In these figures, a die bonder is taken as an example. FIG. 5 is a perspective view showing a schematic configuration of the die bonder. FIGS. 6A and 6B are a plan view and a sectional view, respectively, to help explain the configuration of a wafer adhering section used in the peeling mechanism and pickup mechanism. FIGS. 7A to 7C are plan views to help explain the wafer adhering section and the arrangement of segmented semiconductor wafers. FIG. 8 is a sectional view to help explain an adhesive tape peeling mechanism in the die bonder. FIGS. 9A and 9B are sectional views to help explain an example of the configuration of an auxiliary plate used in peeling adhesive tape by use of the peeling mechanism of FIG. 8. FIGS. 10 and 11 are sectional views to help explain the semiconductor chip pickup mechanism in the die bonder. FIGS. 12A to 12C are schematic diagrams to help explain the process of mounting picked-up semiconductor chips. FIG. 13 is a flowchart for the die bonding process at the die bonder.

The die bonder shown in FIG. 5 comprises a peeling mechanism for peeling adhesive tape, a pickup mechanism for picking up semiconductor chips, a transfer mechanism for transferring the picked-up semiconductor chips onto a leadframe, and a conveyer mechanism for conveying the leadframe.

The peeling mechanism includes a holding table 3, a video camera 4, a peeling claw 21, an auxiliary plate 22, and a suction unit 20. The pickup mechanism is composed of the holding table 3, the video camera 4, the suction collet 10, and the suction unit 20. The video camera 4 and the suction unit 20 are shared by the peeling mechanism and the pickup mechanism.

The holding table 3 has a wafer adhering section 2 composed of a porous member, such as a film-like ceramic member/glass epoxy board, divided (or partitioned) into at least two adhering areas in the direction in which adhesive tape is peeled. In the embodiment, the wafer adhering section 2 has seven adhering areas 2-1 to 2-7 as shown in FIGS. 6A and 6B. Under the adhering areas 2-1 to 2-7, connection holes 23-1 to 23-7 for connecting vacuum pipes are provided respectively. After the formation of elements, the wafer side of a semiconductor wafer where the segmented semiconductor chips 1 are bonded to adhesive tape 24 is caused to adhere to the wafer adhering section 2 and fixed in place. At this time, arranging each semiconductor chip 1 in such a manner that the side of the chip 1 crosses the peeling direction at right angles makes it easy to recognize the position of each semiconductor chip 1 at the time of pickup as shown in FIGS. 7A and 7B. As shown in FIGS. 7A and 7C, arranging each semiconductor chip 1 in such a manner that a diagonal of each chip 1 is parallel with the peeling direction (with an inclination of 45 degrees if the semiconductor chip is a regular square) makes it easy to peel the chip because the adhesive tape 24 starts to peel from the corner of the semiconductor chip 1. Whether to choose the former or latter arrangement should be determined, taking into account the size or thickness of the semiconductor chip 1 and the adhesion of the adhesive tape 24.

The holding table 3 is designed to move each semiconductor chip 1 to the suction unit 20 by moving a semiconductor wafer in the X and Y directions. The video camera 4 is for monitoring the surface of the semiconductor chip 1. The suction unit 20, which is provided under the holding table 3, has two vacuum pumps (or suction pumps) corresponding to the vacuum pipes (or suction pipes) of at least two systems provided so as to correspond to the adhering areas 2-1 to 2-7 of the wafer adhering section 2, a changeover valve that switches between the vacuum pipes, and a control unit that controls the changeover valve.

The transfer mechanism that transfers the semiconductor chip 1 to a leadframe is composed of a bonding tool 8, a suction collet 10, a position correction stage 11, and a bonding head 12. The suction collet 10, which is also used in pickup, adheres by suction to the semiconductor chip 1 peeled from the adhesive tape 24 and transfers it to the position correction stage 11. On the position correction stage 11, the position of the semiconductor chip 1 is corrected. The bonding head 8 transfers the position-corrected semiconductor chip 1 to the leadframe.

Furthermore, the conveyor mechanism that conveys the leadframe is composed of a leadframe supplying section 5, a leadframe conveying unit 6, a paste supplying unit 7, and a leadframe housing section 9. The leadframe supplying section 5, which houses leadframes before die bonding, feeds leadframes to the leadframe conveying unit 6 sequentially. The paste supplying unit 7 applies conductive paste to the bed portion of the leadframe fed to the leadframe conveying unit 6. In addition, the leadframe housing section 9 houses the leadframes subjected to die bonding.

The whole operation of the die bonder configured as described above is roughly as follows. First, a wafer where elements have been formed is segmented into a plurality of semiconductor chips 1. These chips are stuck (or transferred) to adhesive tape 24. The resulting tape is put on the holding table 3. Alternatively, cutting grooves are made along dicing lines (or chip division lines) in the element formation surface side of the wafer where the formation of elements is completed. After the adhesive tape 24 is bonded to the element formation surface, the wafer is segmented into a plurality of semiconductor chips 1 by grinding the backside of the wafer until the cutting grooves have been at least reached (dicing before grinding or BSG: Back Side Grinding). These semiconductor chips 1 are put on the holding table 3.

Next, the suction unit 20 adheres directly to the semiconductor chips 1 by suction and peels the adhesive tape by using the peeling claw 21 and auxiliary plate 22. Then, the holding table 3 is moved in the X and Y directions. Using the video camera 4, the surface of the semiconductor chips 1 is monitored. The image data obtained from the monitoring is converted into binary values or multiple values, thereby sensing the positions of the semiconductor chips and the marks for determining whether the chips are good or bad. Then, while the suction unit 20 is sucking the chips by vacuum (the unit 20 does not necessarily suck the chips depending on the size or thickness of the semiconductor chips), the suction head 10 sucks the semiconductor chip 1, picks up the chip, and transfers it to the position correction stage 11. After the suction head 10 corrects the position of the semiconductor chip 1 and, if necessary, reverses the chip, the bonding head 8 transfers the chip to the leadframe.

After the end of the pickup, the holding table 3 is moved to the position of a semiconductor chip 1 to be picked up next. Then, the above-described operation is repeated.

On the other hand, the leadframe supplying section feeds a leadframe to the leadframe conveying unit 6. The paste supplying unit 7 applies conductive paste to the bed (or die pad) portion of the leadframe conveyed to the leadframe conveying unit 6. Then, the semiconductor chip conveyed by the bonding head 8 is mounted on the bed section of the leadframe. The leadframe subjected to die bonding is housed in the leadframe housing section 9. Such an operation is repeated.

Next, the adhesive tape peeling mechanism and the semiconductor chip pickup mechanism in the die bonder and a peeling method and a pickup method which use the peeling mechanism and pickup mechanism will be explained in further detail by reference to FIGS. 8, 9A, 9B, 10, 11, and 12A to 12C.

A semiconductor wafer (or semiconductor chip 1) where adhesive tape 24 has been bonded to the semiconductor element formation surface is segmented. Such a segmented wafer is prepared (STEP 1) and set on the holding table 3 (STEP 2). As shown in FIG. 8, the holding table 3 is provided with vacuum pipes 25-1, 25-2 of two routes, pipe changeover valves 26-1 to 26-7, and two vacuum pumps 27-1, 27-2. Using these, the adhesive tape 24 is peeled. First, using a first-route vacuum pipe 25-1 and a first vacuum pump 27-1, the semiconductor wafer bonded to the adhesive tape 24 is sucked by vacuum and fixed in place (STEP 3). In this state, the peeling of the adhesive tape 24 is started. In peeling the tape, one end of the adhesive tape 24 is held with the peeling claw 21. The auxiliary plate 22 that aids peeling is set above the adhesive tape 24. The top surface of the adhesive tape 24 is held down with the auxiliary plate 22. In this state, while the adhesive tape 24 is being bent, one end of the adhesive tape 24 is pulled with the peeling claw 21 in the direction of the arrow shown in the figure at a speed of 0.1 mm/sec to 50 mm/sec, more preferably, at a speed of 0.1 mm/sec to 10 mm/sec (STEP 4). At this time, the peeling claw 21 may be pulled with a variable force. Alternatively, the tape may be peeled by moving the claw 21 and auxiliary plate 22 at a constant speed. Still alternatively, after the tape is pulled with the claw 21 for a specific distance, the top surface of the adhesive tape 24 may be held down with the auxiliary plate 22 repeatedly. Then, when a part of the adhesive tape 24 near the adjacent adhering areas 2-1 to 2-7 of the wafer adhering section 2 is peeled, the changeover valves 26-1 to 26-7 switch to a second-route vacuum pipe 25-2, which causes a second vacuum pump 27-2 to adhere by suction to the peeled semiconductor chip 1 in the adhering area and fix the remaining chips in place (STEP 5). FIG. 8 shows a state where the tape is peeled as far as the boundary area between the adhering area 2-1 and adhering area 2—2 and the changeover valve 26-1 has been switched.

Similarly, the changeover valves 26-2 to 26-7 are switched sequentially as the adhesive tape is peeled. Then, in a state where the adhesive tape 24 has been peeled completely, each semiconductor chip 1 is transferred from the adhesive tape 24 to the wafer adhering section 2. Then, the second vacuum pump 27-2 adheres to each semiconductor chip by suction via the second-route vacuum pipe 25-2 and fixes the chip in place (STEP 6).

The auxiliary plate 22 may has a rounded tip as shown in FIG. 9A or a sharp tip as shown in FIG. 9B. The shape of the tip portion is determined so as to peel the tape optimally according to the thickness, adhesion, or flexibility of the adhesive tape 24.

Next, after the position of the semiconductor chip 1 is sensed and whether the chip is good or bad is determined (STEP 7), the picking up of each semiconductor chip 1 from the wafer adhering section 2 is started. Immediately after the pickup is started, the second vacuum pump 27-2 causes the second-route vacuum pipe 25-2 to adhere to each semiconductor chip 1 by suction and fix it in place. In this state, use of the suction collet 10 causes the chip to be picked up only by suction (STEP 8). When the pickup proceeds close to the boundary of the adhering areas, the changeover valve is switched to the first-route vacuum pipe 25-1, which causes the first vacuum pump 27-1 to suck in the picked-up adhering area (STEP 9-1). FIG. 10 shows a state where the pickup is almost completed up to the adhering area 2-1 and the changeover valve 26-1 corresponding to the adhering area 2-1 is closed.

As a result, the semiconductor chip 1 is picked up and a part of the wafer adhering section 2 is exposed, which not only prevents the suction of the second vacuum pump 27-2 from decreasing but also adheres by suction to the defective semiconductor chips remaining in the exposed wafer adhering section 2 and the elements on the periphery of the wafer, or non-product parts, and fixes them in place.

The changeover valve may be closed to stop the suction as shown in FIG. 11, when the pickup proceeds and a semiconductor chip in the adhering area is picked up (STEP 9-2). FIG. 11 shows a state where the pickup proceeds to the adhering area 2-4 and the changeover valves 26-1 to 26-3 corresponding to the adhering areas 2-1 to 2-3 are closed.

Thereafter, as shown in FIGS. 12A to 12C, die bonding is done to a leadframe (STEP 10). FIG. 12A schematically shows the process of peeling the adhesive tape 24. FIG. 12B schematically shows the pickup process. FIG. 12C schematically shows the process of mounting the semiconductor chip 1 onto a leadframe 13 with conductive paste 14.

Then, the defective products and the elements on the periphery of the wafer, or non-product parts, are discarded (STEP 11).

According to the above configuration and method, segmented semiconductor wafers can be caused to adhere by an optimal suction and be fixed in place effectively according to the peeling position of adhesive tape or the pickup state of a semiconductor chip. Consequently, cracks and chipping in the semiconductor chips can be prevented in peeling the adhesive tape or at the time of pickup. Such cracks and chipping became a problem in making semiconductor chips thinner. Since pickup is carried out only by adhesion, this prevents the thrust pin contact section from causing damage to the semiconductor chip. This damage was a problem in picking up a chip with a conventional thrust pin.

In the prior art, when the thickness of a semiconductor chip was 50 µm or less, many cracks occurred when the semiconductor chip was picked up (100 pcs/100 pcs). Use of the embodiment of the present invention reduced the occurrence of cracks to an almost negligible level (0/100 pcs), even when the thickness of the semiconductor chip was 50 µm or less.

While in the first embodiment, explanation has been given taking a die bonder as an example, the present invention may, of course, be applied to another semiconductor manufacturing apparatus that requires an adhesive tape peeling mechanism and a semiconductor chip pickup apparatus. For example, this invention may be applied to a picker that, after the adhesive tape 24 is peeled, picks up each semiconductor chip 1 and packages it in a tray 15 as shown in FIGS. 14A, 14B, and 14C. The present invention may be applied to a flip chip bonder that, after the adhesive tape 24 is peeled, picks up each semiconductor chip 1 and mounts the chip on a printed circuit board 16 by flip-chip connection as shown in FIGS. 15A, 15B, and 15C. The invention may be applied to a film adhesion bonder that, after the adhesive tape 24 is peeled, picks up each semiconductor chip 1 and mounts the chip on a thermoplastic film substrate 17 as shown in FIGS. 16A to 16C. The invention may be applied to an inner lead bonder that, after the adhesive tape 24 is peeled, picks up each semiconductor chip 1 and mounts the chip on TAB tape 18 using heating tools 19a, 19b as shown in FIGS. 17A to 17C.

The adhesive tape 24 may comprise a base layer 24-1 and an adhesive layer 24-2, which can be separated from each other. In this case, the semiconductor chips 1 are picked up will be described with reference to FIGS. 55A and 55B.

Figure 55A:
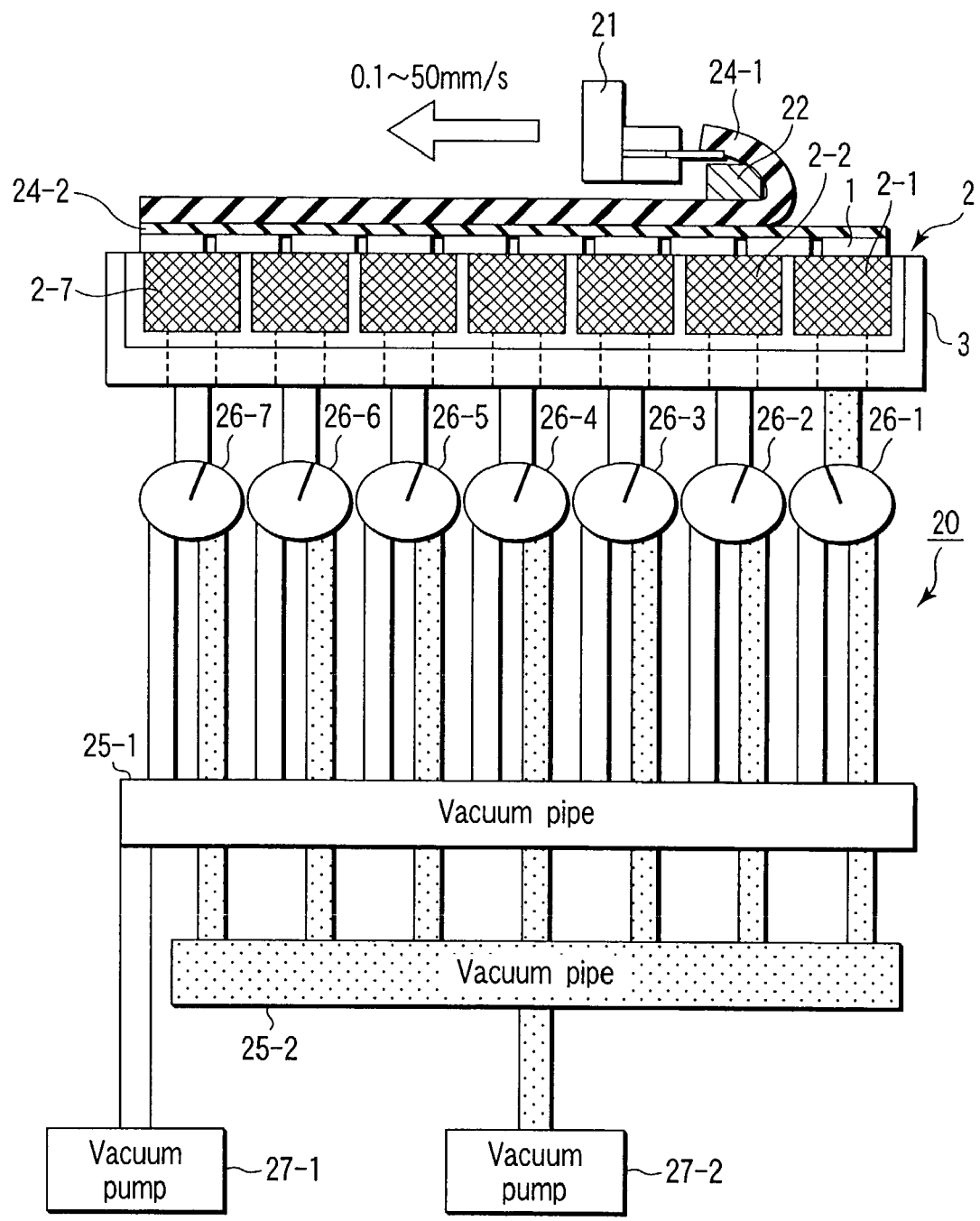
FIGS. 55A and 55B are sectional views to help explain another example of the adhesive tape.
Figure 55B:
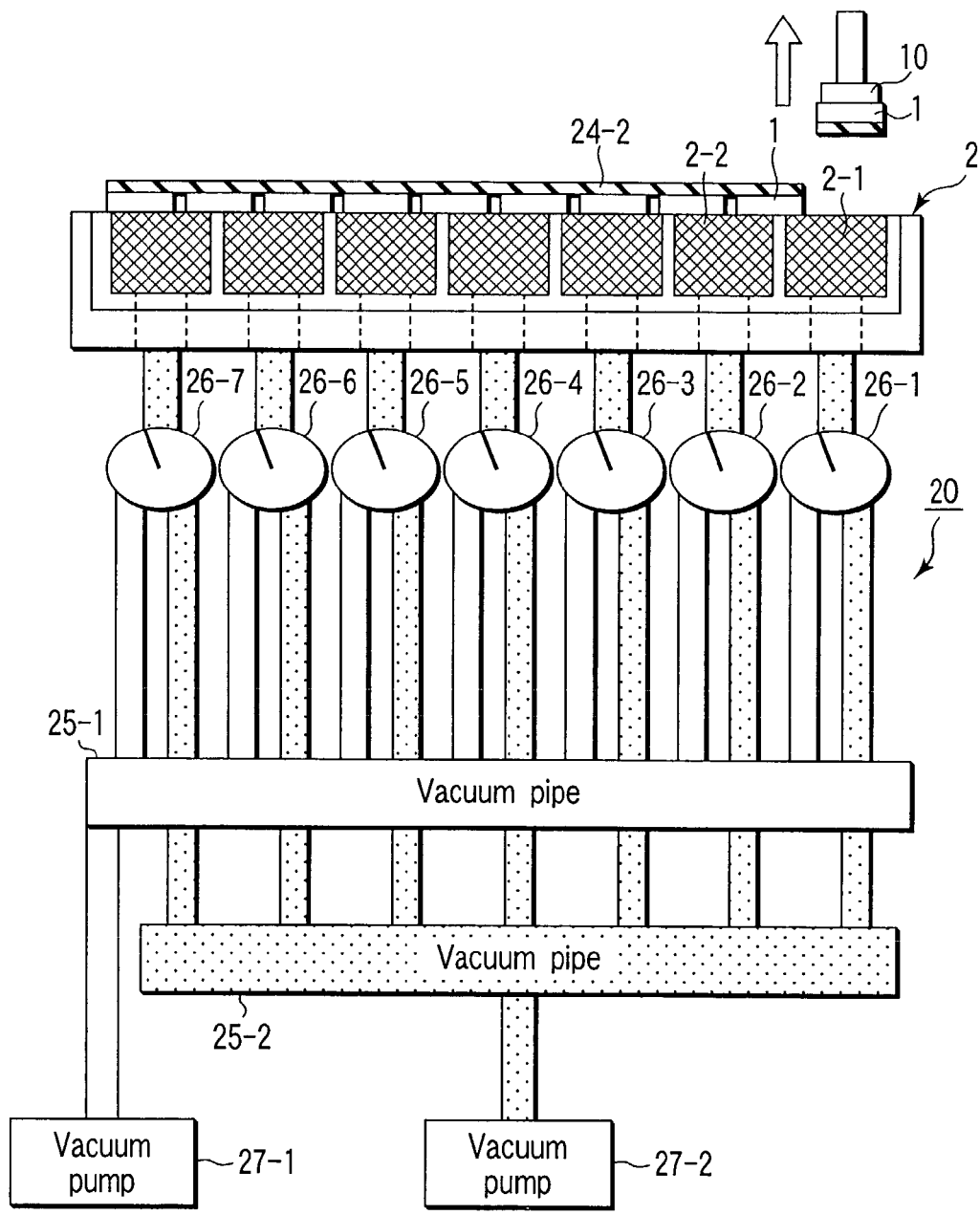

First, only the base layer 24-1 is peeled from the adhesive layer 24-2 as illustrated in FIG. 55A. The adhesive layer 24-2 remains adhered to the semiconductor chips 1. Then, as shown in FIG. 55B, the suction collet 10 lifts a semiconductor chip 1, thus picking up the chip 1. At this time, that part of the adhesive layer 24-2 which holds the chip 1 is torn from the remaining part of the adhesive layer 24-2. The adhesive layer 24-2 has so high a strength that the part may no be torn from the other part as the collet 10 lifts the chip 1. If this is the case, the chip 1 may be picked up by one of the following three alternative methods. The first method is to apply a laser beam to the adhesive layer 24-1, cutting the layer 24-1 along the border between the chip 1 and the adjacent chip 1. The second method is to cut the layer 24-2 with a sharp cutter. The third method is to apply solvent to the layer 24-2, removing a narrow part of the layer 24-2 lying between the chips 1.

Figure 18:
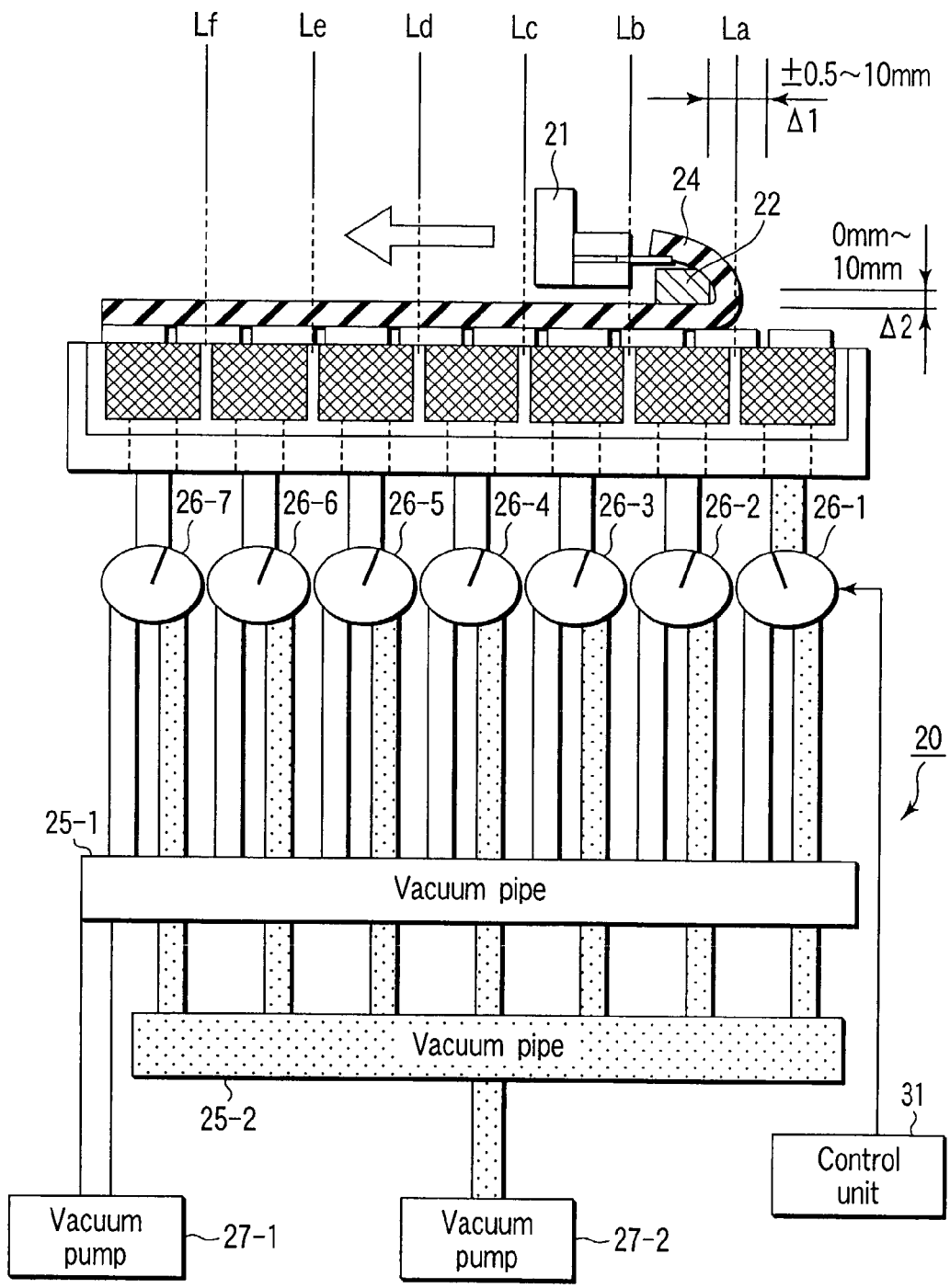
FIG. 18 is a sectional view which helps explain a second embodiment of the present invention and which shows a configuration of a wafer adhering section and its vicinity used in a peeling mechanism.

FIG. 18 helps explain an adhesive tape peeling mechanism, an adhesive tape peeling apparatus, an adhesive tape peeling method, a semiconductor chip pickup apparatus, a semiconductor chip pickup method, a semiconductor device manufacturing method, and a semiconductor device manufacturing apparatus which are related to a second embodiment of the present invention. FIG. 18 shows another configuration of the wafer adhering section 2 used in the peeling mechanism. The peeling mechanism includes a control unit 31 that switches between changeover valves 26-1 to 26-7 according to the amount of peeling of the adhesive tape 24. In FIG. 18, the same component parts as those in FIG. 8 are indicated by the same reference numerals and a detailed explanation of them will not be given.

In the second embodiment, the amount of peeling of the adhesive tape 24 is sensed according to the position (e.g., La to Lf) of the peeling claw 21, the position of the auxiliary plate 22, changes in the suction of the vacuum pumps 27-1, 27-2, and the like. On the basis of the result of the sensing, as the peeling of the adhesive tape 24 moves over the adhering areas 2-1 to 2-7, the changeover valves 26-1 to 26-7 are switched sequentially.

A sensing error of $\Delta 1$ in the positions La to Lf of the peeling claw 21 (or auxiliary plate 22) is in the range of ±0.5 to 10 mm, more preferably ±0.5 to 5 mm. The height $\Delta 2$ of the auxiliary plate 22 is in the range of 0 to 10 mm from the surface of the adhesive tape 2, more preferably 0 to 5 mm.

This configuration assures higher accuracy and prevents cracks and chipping from occurring when the adhesive tape 24 is peeled, even if semiconductor chips are thin.

Control of the changeover valves 26-1 to 26-7 by the control unit 31 may, of course, be applied to picking up semiconductor chips.

FIGS. 19A and 19B, FIGS. 20A and 20B, FIGS. 21A and 21B, FIGS. 22A and 22B, and FIGS. 23A and 23B show an adhesive tape peeling mechanism, an adhesive tape peeling apparatus, an adhesive tape peeling method, a semiconductor chip pickup apparatus, a semiconductor chip pickup method, and a semiconductor device manufacturing method, all according to the third embodiment of the present invention. More precisely, these figures illustrate a sequence of peeling an adhesive tape and a sequence of picking up a semiconductor chip. The third embodiment is advantageous in processing small semiconductor chips (e.g., chips having a size of 3×3 mm or less), each having a film (e.g., surface protective film) that is very firmly adhered to an adhesive tape, or for semiconductor chips, each having large concaves and convexes (like a chip having bumps on its surface).

Figure 19A:
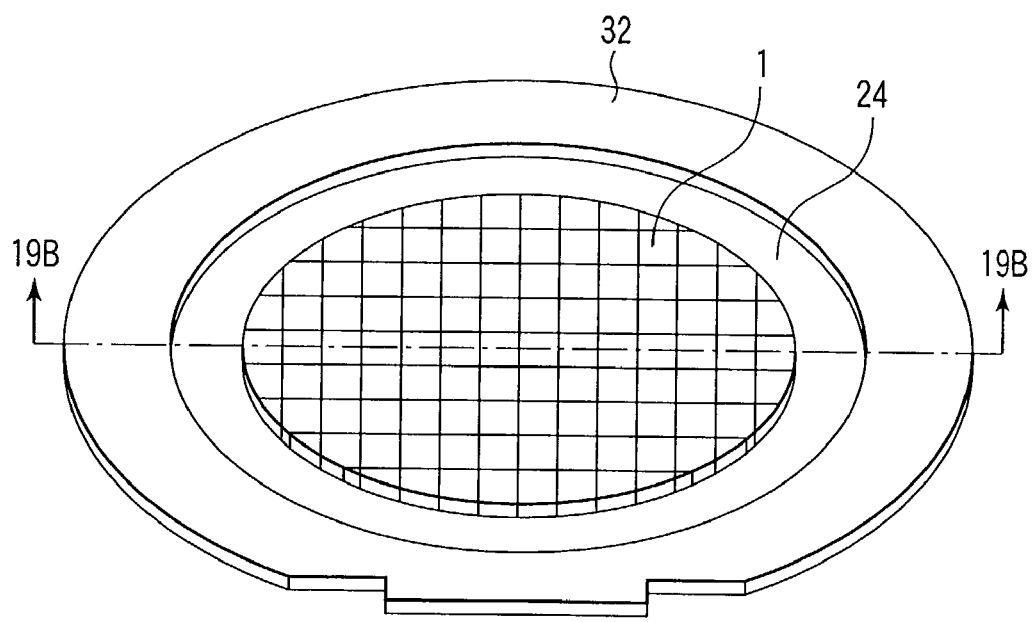
FIG. 19A is a perspective view showing a state of a semiconductor wafer that has been just ground which helps explain a third embodiment of the present invention.
Figure 19B:
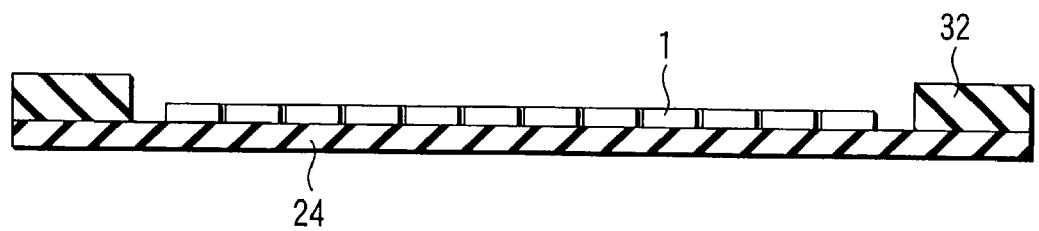
FIG. 19B is a sectional view taken along line 19B—19B in FIG. 19A.

FIGS. 19A and 19B show a semiconductor wafer that has been just ground by dicing before grinding method. FIG. 19A is a perspective view of the wafer and FIG. 19B is a sectional view taken along line 19B—19B in FIG. 19A. As seen from FIGS. 19A and 19B, an adhesive tape 24 is adhered to a wafer ring 32. Semiconductor chips 1 are bonded to the adhesive tape 24. Both the wafer ring 32 and the adhesive tape 24 have been used in the step of grinding the backside of the semiconductor wafer. It is desired that the adhesive tape 24, which is disc-shaped, be larger than the wafer, protruding from the circumference of the wafer. The circumferential part of the tape 24 should protrude from the wafer for a distance of, for example, 2 mm or more.

Figure 20A:
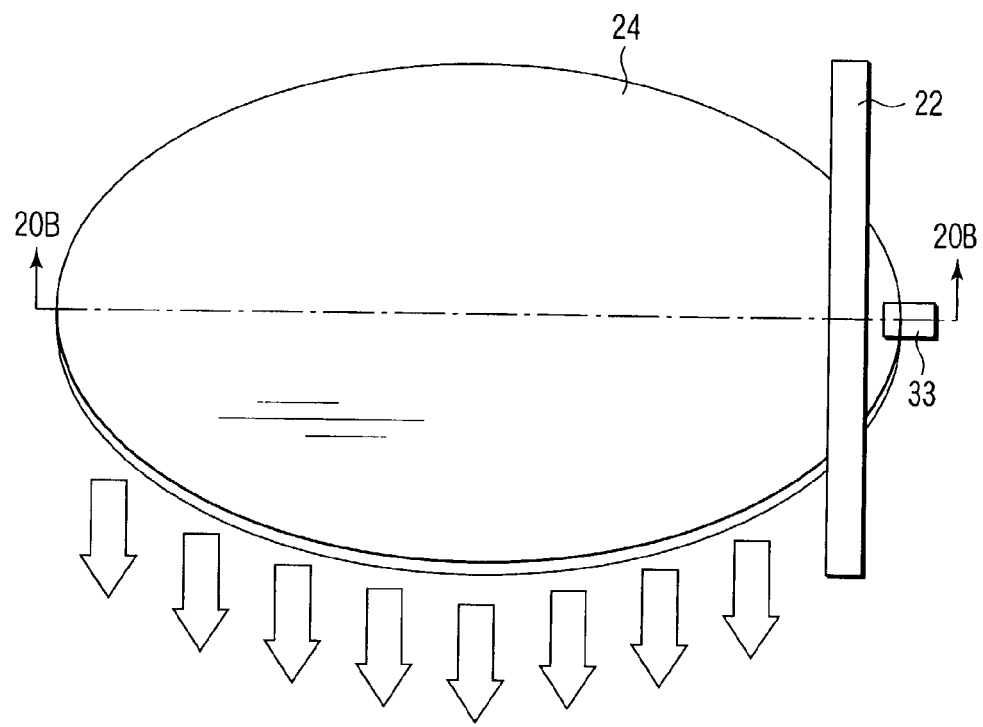
FIG. 20A is a perspective view showing an early process of peeling an adhesive tape which helps explain a third embodiment of the present invention.
Figure 20B:
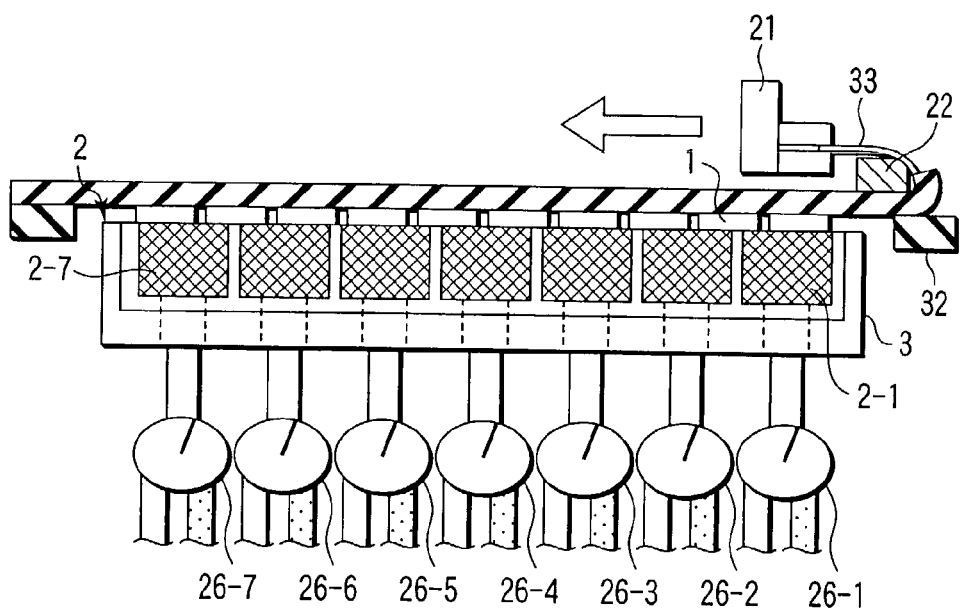
FIG. 20B is a sectional view taken along line 20B—20B in FIG. 20A.

To peel the adhesive tape 24 from the semiconductor chips 1, a peeling tape 33 is adhered to the periphery of the adhesive tape 24 that is bonded to the wafer ring 32, as is illustrated in FIGS. 20A and 20B. The peeling apparatus pinches the peeling tape 33 with the peeling claw 21 and pulls the tape 33 in a direction parallel to the surface of the wafer, thus gradually peeling the adhesive tape 24 from the wafer ring 32. Alternatively, the peeling apparatus may pinches the edge of the adhesive tape 24 with the peeling claw 21 and pulls the tape 24 in a direction parallel to the surface of the wafer, thereby gradually peeling the adhesive tape 24 from the wafer ring 32.

After peeled completely from the wafer ring 32, the adhesive tape 24 will then be peeled from semiconductor chips 1, which are at the circumferential part of the wafer held by the wafer holder (suction table). At this time, the tape 24 has already been peeled for a distance AL as shown in FIG. 23A. At the circumferential part of the wafer, the peeled part of the adhesive tape 24 is inclined at an obtuse angle $\Delta X$ (90° or more) to the surface of each semiconductor chip 1.

This can minimize the force necessary for peeling the adhesive tape 24 from the semiconductor chip (wafer) 1. If the chip 1 is small, the tape 24 can be peeled from the chip 1 even if the tape 24 is firmly adhered to the surface protective film or if the chip 1 has large concaves and convexes. Hence, the chip 1 would not remain on the adhesive tape 24.

Figure 21A:
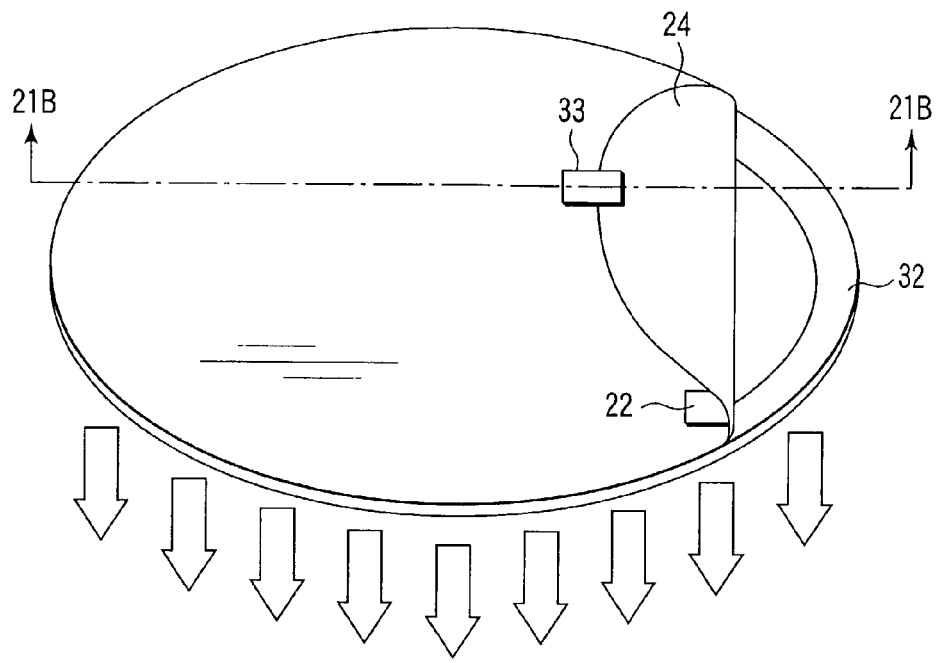
FIG. 21A is a perspective view showing the middle of peeling the adhesive tape which helps explain a third embodiment of the present invention.
Figure 21B:
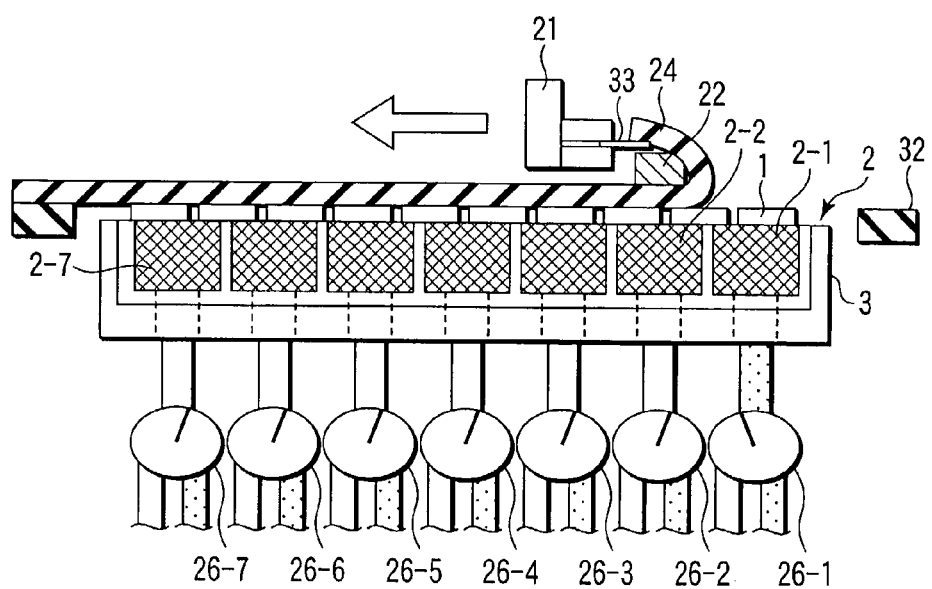
FIG. 21B is a sectional view taken along line 21B—21B in FIG. 21A.

The adhesive tape 24 is peeled further from the wafer as shown in FIGS. 21A and 21B, in the same way as in the first and second embodiments. As the peeling of the tape 24 so proceeds, the changeover valves 26-2 to 26-7 located in the partitioned suction areas of the wafer adhering section 2 are actuated one after another. Thus, the semiconductor chips 1, released from the tape 24, are secured to the wafer adhering section 2 by virtue of vacuum suction.

Figure 22A:
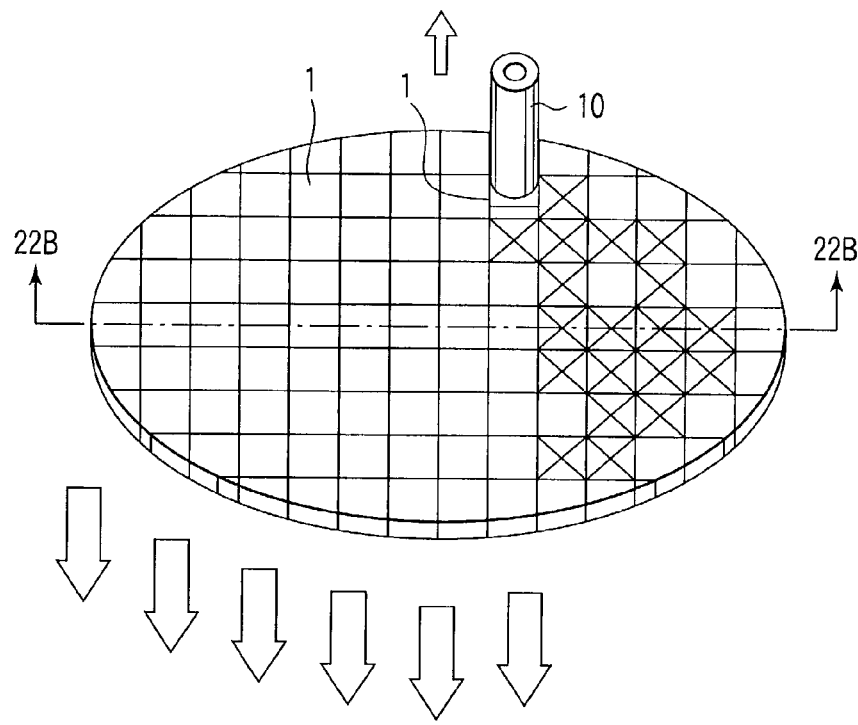
FIG. 22A is a perspective view showing the step of picked-up semiconductor chips which helps explain the third embodiment of the present invention.
Figure 22B:
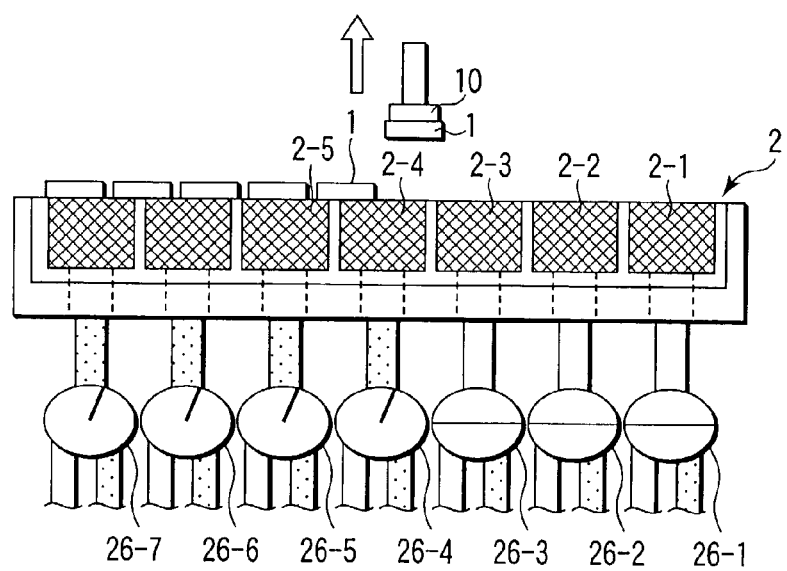
FIG. 22B is a sectional view taken along line 22B—22B in FIG. 22A.

Thereafter, the semiconductor chips 1 transferred from the adhesive tape 24 to the wafer adhering section 2 are detected and picked up, one by one, each drawn to the suction collet 10, as illustrated in FIGS. 22A and 22B.

The semiconductor chips 1 thus picked up are subjected to die bonding and tray packing.

The third embodiment can reliably peel an adhesive tape from semiconductor chips 1, if the chips 1 are small and the suction force for hold them is therefore small, if the film provided on each chip is firmly bonded to the adhesive tape, or if the chips have large concaves and convexes in its surface. Hence, the third embodiment can pick up the semiconductor chips without fail.

A wafer ring 32 is used in the third embodiment. Nonetheless, wafer rings need not be used, as in the first embodiment and the second embodiment. If no wafer ring is used, the adhesive tape 24 may have a diameter larger than that of the semiconductor wafer (for example, by 2 mm). In this case, the tape 24 protrudes from the circumference of the wafer and is therefore easy to peel.

As indicated above, that part of the adhesive tape 24, which is being peeled from any semiconductor chip 1 provided at a circumferential part of the wafer, is inclined at an obtuse angle to the surface of the semiconductor chip 1. This prevents the chip 1 from remaining on the adhesive tape 24.

FIG. 24 helps explain an adhesive tape peeling mechanism, an adhesive tape peeling apparatus, an adhesive tape peeling method, a semiconductor chip pickup apparatus, a semiconductor chip pickup method, a semiconductor device manufacturing method, and a semiconductor device manufacturing apparatus which are related to a second embodiment of the present invention. FIG. 24 schematically shows the configuration.

In the fourth embodiment, the mechanism of peeling the adhesive tape 24 is housed in a chamber 27 (with the top surface of the holding table being hermetically sealed) and pressure is applied to the adhesive tape 24 to be peeled. In this case, the wafer adhering section 2 draws vacuum from the back. This makes larger the difference in pressure between the inside of the chamber 27 and the fixed section of the semiconductor chip 1, thereby fixing the semiconductor chip 1 in place by a strong suction, which enables the adhesive tape 24 to be peeled from the semiconductor chip 1.

With this configuration, the suction of segmented semiconductor wafers can be increased, which makes it relatively easy to peel the adhesive tape even if the tape has a high adhesion.

Of course, not only the adhesive tape peeling mechanism but also the pickup apparatus may be housed in the chamber. Such an adhesive tape peeling mechanism and pickup apparatus may be applied to another semiconductor device manufacturing apparatus.

FIGS. 25A, 25B to 43A, 43B show various examples of the configuration of the wafer adhering section applied to the first to fourth embodiments. FIGS. 25A and 25B show a case where a porous member of the wafer adhering section is divided into two adhering areas in the direction in which the adhesive tape is peeled. FIGS. 26A and 26B show a case where a porous member of the wafer adhering section is divided into five adhering areas in-the direction in which the adhesive tape is peeled. FIGS. 27A and 27B show a case where a porous member of the wafer adhering section is divided into nine adhering areas in the direction in which the adhesive tape is peeled.

FIGS. 28A, 28B to 31A, 31B show a case where a porous member of the wafer adhering section is divided not only into a plurality of parts in the direction in which the adhesive tape is peeled but also in two in the direction perpendicular to the peeling direction, thereby forming 4, 10, 14 and 18 adhering areas, respectively.

FIGS. 32A, 32B to 37A to 37B show a case where a plate 28 with a large number of through holes is provided on a porous member of the wafer adhering section and a segmented semiconductor wafer 1 is caused to adhere by suction via the plate 28. In FIGS. 32A and 32B, the porous member is divided into two adhering areas in the direction in which adhesive tape is peeled. In FIGS. 33A and 33B, the porous member is divided into five adhering areas. In FIGS. 34A and 34B, the porous member is divided into seven adhering areas. In FIGS. 35A and 35B, the porous member is divided in two in the direction in which adhesive tape is peeled and in two in the direction perpendicular to the peeling direction, thereby forming four adhering areas. In FIGS. 36A and 36B, the porous member is divided into ten adhering areas. In FIGS. 37A and 37B, the porous member is divided into 14 adhering areas.

FIGS. 38A, 38B to 43A to 43B show a case where a plate 30 with through holes corresponding to the individual semiconductor chips is provided on a porous member of the wafer adhering section and each semiconductor chip is caused to adhere by suction via the plate 30. In FIGS. 38A and 38B, the porous member is divided into two adhering areas in the direction in which adhesive tape is peeled. In FIGS. 39A and 39B, the porous member is divided into five adhering areas. In FIGS. 40A and 40B, the porous member is divided into seven adhering areas. In FIGS. 41A and 41B, the porous member is divided in two in the direction in which adhesive tape is peeled and in two in the direction perpendicular to the peeling direction, thereby forming four adhering areas. In FIGS. 42A and 42B, the porous member is divided into ten adhering areas. In FIGS. 43A and 43B, the porous member is divided into 14 adhering areas.

Each of the above-described configurations of the wafer adhering section is basically the same as that of the wafer adhering section shown in FIGS. 6A and 6B. From those configurations, the best one should be selected, taking into account the size and thickness of the semiconductor chip 1 and the adhesion, thickness, and flexibility of the adhesive tape 24.

FIGS. 44A and 44B are sectional views to help explain another configuration of the wafer adhering section applied to the first to fourth embodiments. In FIGS. 44A and 44B, porous adhesive tape and a support member for the porous adhesive tape are used to adhere to a segmented semiconductor wafer by suction. FIG. 44A is a sectional view of the porous adhesive tape and FIG. 44B is a sectional view of the support member.

A porous adhesive tape 40 is used to transfer the semiconductor chips 1 bonded to the adhesive tape 24. Adhesives 42-1, 42-2 are applied to both sides of a porous member 41 of the porous adhesive tape 40 in such a manner that a large number of holes through which air passes from one side to the other are not filled with the adhesives so as to assure breathability. Any material, such as ceramic or resin, may be used as the porous member 41, provided that it is porous. The adhesion of the adhesives 42-1 and 42-2 are set lower than that of an ordinary adhesive tape. The porous adhesive tape 40 has a round shape so as to fit the outward form of a semiconductor wafer. On the side face of the porous adhesive tape 40, an air leak prevention tool 43 is provided to prevent air from leaking. The air leak prevention tool 43 is formed by, for example, adhesive resin or adhesive tape.

On the other hand, in a support member 45, through holes 44-1 to 44-7 for vacuum suction which pass through from one side to the other are made. These through holes 44-1 to 44-7 are provided so as to correspond to, for example, the changeover valves 26-1 to 26-7 for the vacuum pipes 25-1, 25-2 of two routes in FIG. 8.

Then, as shown in FIG. 45, the reverse of the semiconductor chip adhering (transfer) side of the porous adhesive tape 40 is bonded to the support member 45.

Figure 46A:
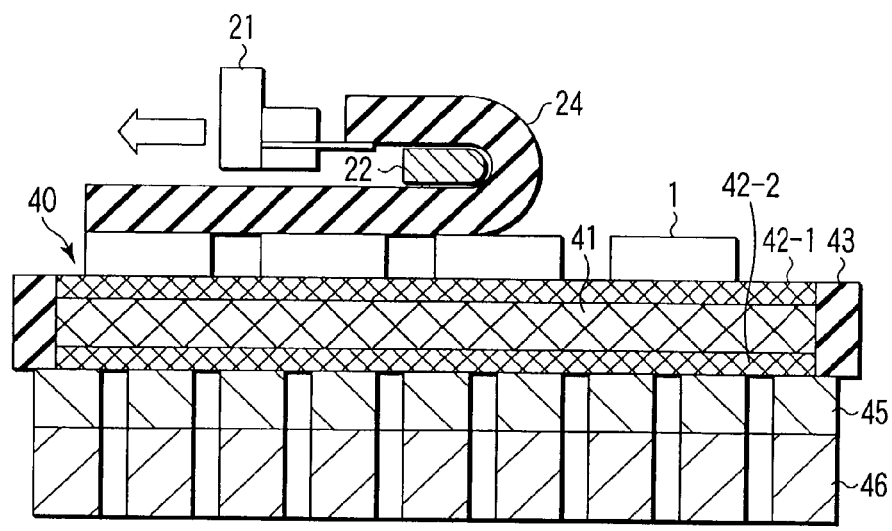
FIGS. 46A to 46C are sectional views to help explain the process of peeling the adhesive tape when the porous adhesive tapes shown in FIGS. 44A, 44B and 45 are used.

Next, the process of peeling the adhesive tape 24 when the porous adhesive tape 40 shown in FIGS. 44A, 44B and 45 is used will be explained by reference to FIGS. 46A to 46C.

Fixing jigs 46 with connection holes for connecting vacuum pipes are provided on the bottom surface of the support member 45 so as to correspond to the vacuum suction through holes 44-1 to 44-7 in the support member 45. A vacuum is drawn by the vacuum pump 27-1 via the vacuum suction through holes in the support member 45, the connection holes in the fixing jigs 46, and a large number of holes in the porous adhesive tape 40. This enables the vacuum suction by the vacuum pump 27-1 and the adhesion of the adhesive 42-1 to fix the segmented semiconductor wafer (semiconductor chips) to the porous adhesive tape 40.

As a result, the vacuum suction compensates for the low adhesion of the porous adhesive tape 40.

With the semiconductor chip 1 caused to adhere by suction via the support member 45, the adhesive tape 24 bonded to the semiconductor chip 1 is pulled in the direction of the arrow, thereby peeling the tape. In peeling the tape, one end of the adhesive tape 24 is held with the peeling claw 21, and the auxiliary plate 22 to help peel is set above the adhesive tape 24. While the adhesive tape 24 is being bent, with the top surface of the adhesive tape 24 being held down with the auxiliary plate 22, one end of the adhesive tape 24 is pulled with the peeling claw 21 in the direction of the arrow, thereby peeling the tape. At this time, when a part of the adhesive tape 24 corresponding to the adjacent adhering through hole in the wafer adhering section is peeled, the changeover valve switches to the second-route vacuum pipe 25-2, which enables the suction of the vacuum pump 27-2 and the adhesion of the adhesive 42-1 to fix the peeled semiconductor chip in place. In the embodiment, the porous member 41 of the porous adhesive tape 40 is not partitioned. Since resistance to the suction becomes greater as the distance becomes larger, the porous member 41 applies suction mainly to the semiconductor chip 1 close to the vacuum suction through hole, with the result that the vicinity of the through hole becomes an adhering area. A drop in the suction due to no partition can be compensated for by the adhesion of the adhesive 42-1. This produces the same effect as when the porous member is partitioned into a plurality of parts.

Figure 46B:
Figure 46B:
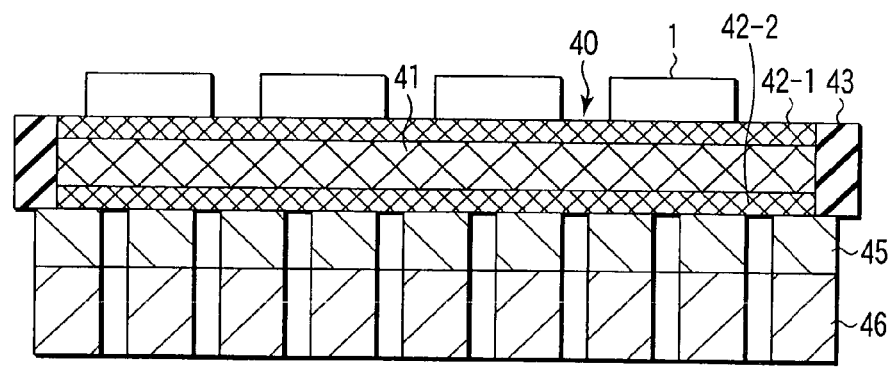
Figure 46C:
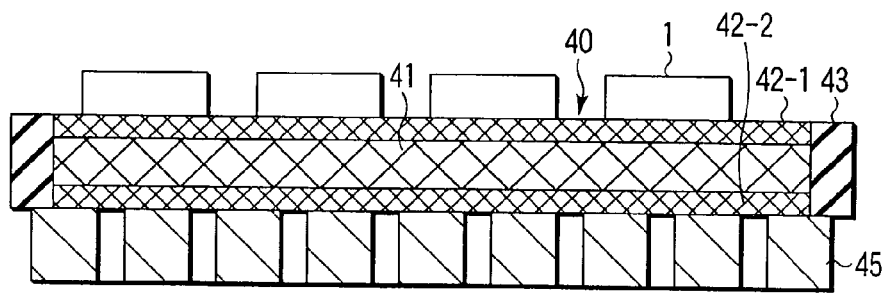

After the peeling of the adhesive tape 24 is completed, when the suction by the vacuum pump 27-2 is stopped, the state shown in FIG. 46B results. In this state, each semiconductor chip 1 is fixed in place by the adhesion of the adhesive 42-1. When the fixing jig 46 is removed from the support member 45, the semiconductor chips 1 are transferred to the porous adhesive tape 40 bonded onto the support member 45 as shown in FIG. 46C.

The pickup process is carried out as shown in 47A. Of the semiconductor chips 1 transferred to the porous adhesive tape 40, the good products are selected and caused to adhere by the vacuum suction of the suction collet 10 and be picked up in the direction of the arrow (upward). In this case, each semiconductor chip 1 is fixed only by the adhesion of the adhesive 42-1. In this state, the chip is picked up only by the suction of the suction collet 10. This enables the defective chips 1' remaining in the exposed wafer adhering section and the elements on the periphery of the wafer, non-product parts, to be fixed.

The semiconductor chip 1 may be fixed in place by both of the vacuum suction and the adhesion of the porous adhesive tape 40 by drawing vacuum, if necessary, according to the size or thickness of the semiconductor chip 1 or the adhesion of the porous adhesive tape 40.

Figure 47A:
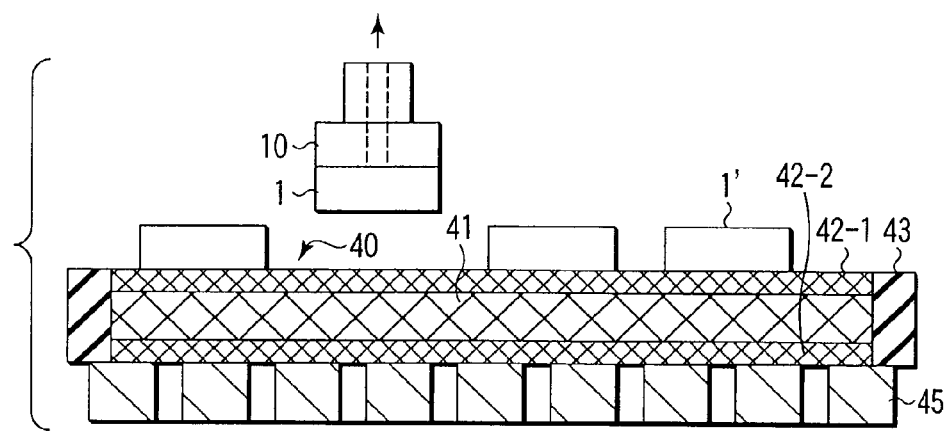
FIGS. 47A to 47C are sectional views to help explain a pickup process when the porous adhesive tapes shown in FIGS. 44A, 44B and 45 are used.
Figure 47B:
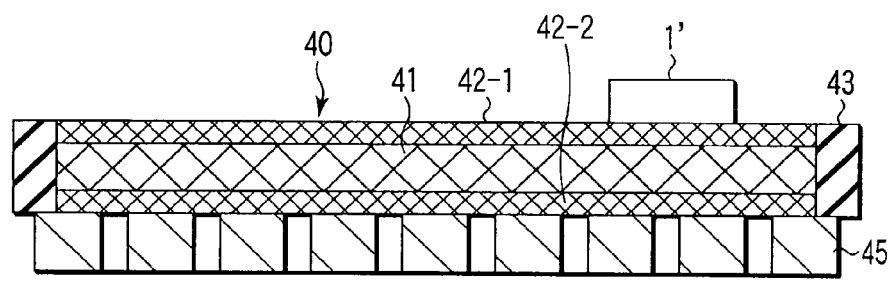

FIG. 47B shows a state where the good semiconductor chips 1 have been picked up and the defective semiconductor chips 1' have remained on the porous adhesive tape 40.

Figure 47C:
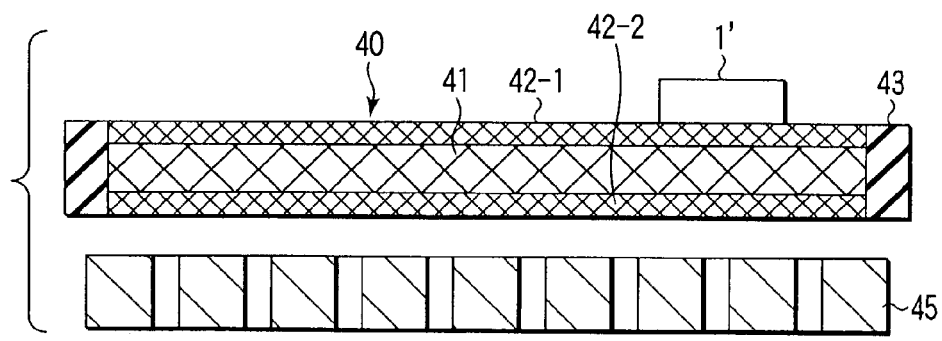

Thereafter, the support member 45 is removed from the porous adhesive tape 40 on which the defective semiconductor chips 1' and the elements on the periphery of the wafer, non-product parts, remain as shown in FIG. 47C.

The support member 45 can be used repeatedly in the process of picking up subsequent semiconductor chips. On the other hand, the porous adhesive tape 40 is discarded together with the defective semiconductor chips 1' and the elements on the periphery of the wafer, non-product parts, bonded to the tape.

When a semiconductor chip 1 is picked up by the suction collet 10, the wafer adhering section with the aforementioned configuration enables even a thinned semiconductor chip 1 to be peeled easily from the porous adhesive tape 40 because the porous adhesive tape has a low adhesion. This prevents damage to the semiconductor chip 1 caused at the time of pickup and contributes to an improvement in the manufacturing yield.

While in the explanation, the adhesives 42-1, 42-2 are applied to both sides of the porous adhesive tape 40, the adhesive 42-1 may be applied only to the semiconductor-chip-adhering surface of the porous adhesive tape 40. In this case, adhesive is applied in advance to the surface of the support member 45.

Figure 48A:
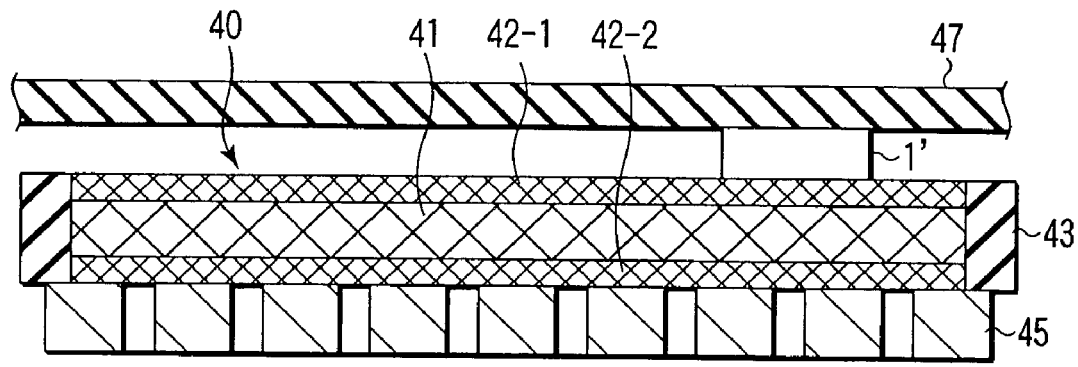
FIGS. 48A and 48B are sectional views to help explain the process of removing defective semiconductor chips to reuse the porous adhesive tape.
Figure 48B:
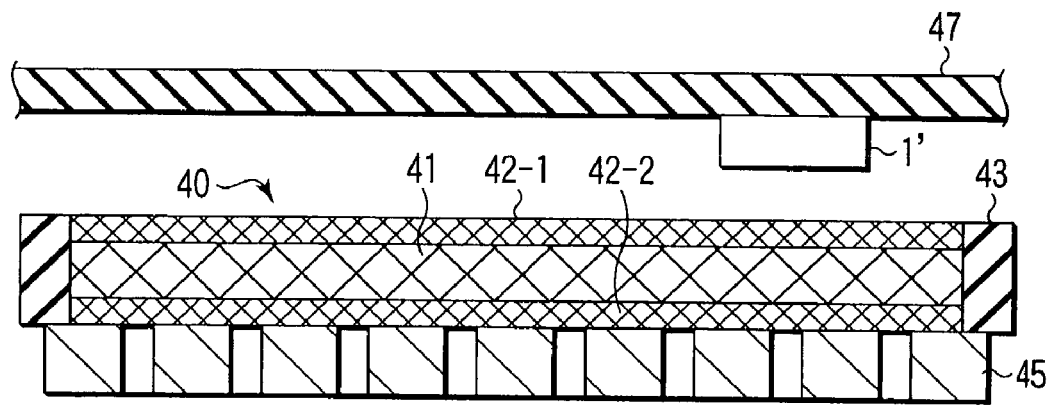

In the above example, the support member 45 is removed from the porous adhesive tape 40 and reused, whereas the porous adhesive tape 40 on which the defective semiconductor chips 1' and the elements on the periphery of the wafer, non-product parts, remain is discarded. However, as shown in FIG. 48A, adhesive tape 47 may be bonded to the surface of the defective chips 1' (or the elements on the periphery of the wafer, non-product parts), the defective semiconductor chips 1' may be peeled from the porous adhesive tape 40 as shown in FIG. 48B, and then the adhesive tape 47 and defective semiconductor chips 1' may be discarded. In this case, the adhesion of the adhesive tape 47 has to be higher than that of the adhesive 42-1.

Thereafter, the support member 45 and porous adhesive tape 40 are used again in the next pickup process. In this way, the porous adhesive tape 40 is reused, for example, twice to ten times, which helps reduce the cost.

Figure 49A:
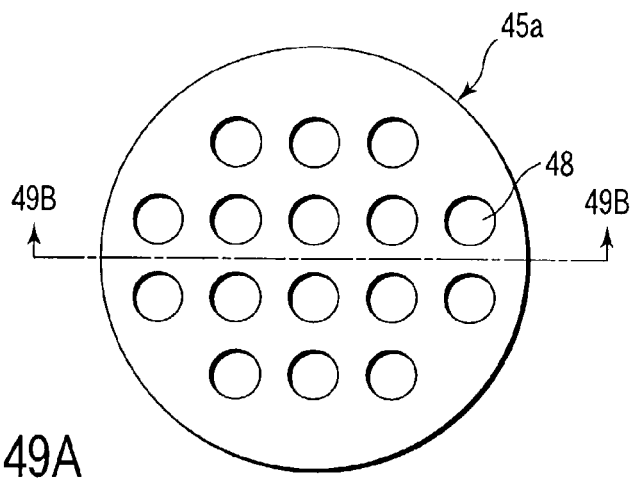
FIG. 49A is a plan view to help explain a more concrete configuration of the support member.
Figure 49B:
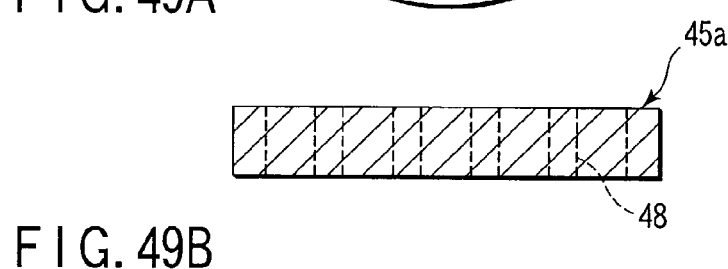
FIG. 49B is a sectional view taken along line 49B—49B of FIG. 49A to help explain the more concrete configuration of the support member.

Next, a concrete configuration of the support member 45 will be explained using several examples. FIGS. 49A and 49B are a plan view and a sectional view of the support member, respectively. FIGS. 54A and 54B are a plan view and a sectional view of the support member, respectively.

The support member 45a shown in FIGS. 49A and 49B is a round flat plate which is composed of metal, ceramic, resin, or the like and which has a plurality of through holes 48 made in it. These through holes 48 are provided so as to correspond to the vacuum suction through holes (the connection holes for connecting the vacuum pipes).

Figure 50A:
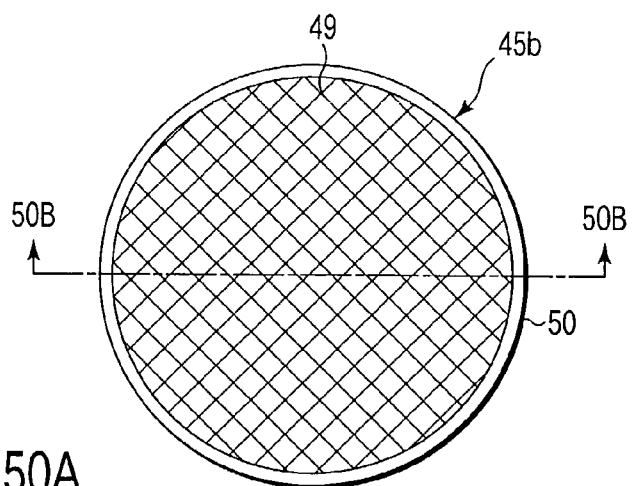
FIG. 50A is a plan view to help explain another more concrete configuration of the support member.
Figure 50B:
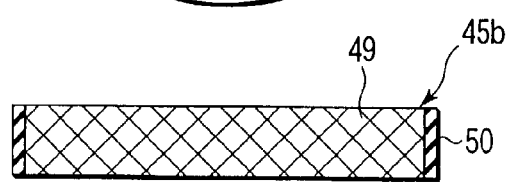
FIG. 50B is a sectional view taken along line 50B—50B of FIG. 50A to help explain the one other more concrete configuration of the support member.

The support member 45b shown in FIGS. 50A and 50B is a round flat plate 49 which is composed of a porous member with many air-passing holes made of ceramic, resin, or the like and has an air leak prevention tool 50 on its side face.

The support member 45c shown in FIGS. 51A and 51B is a flat plate which is made of metal, ceramic, resin, or the like and in the center of which a through hole 51 is made.

No adhesive has been applied to the surface of any of the support members 45a, 45b, and 45c shown in FIGS. 49A and 49B to FIGS. 51A and 51B. Therefore, when such support members 45a, 45b, and 45c are used, the adhesive 42-2 has to be applied in advance to the surface of the porous adhesive tape 40 adhering to the support members 45a, 45b, 45c.

In contrast, the support members 45d, 45e, 45f shown in FIGS. 52A and 52B to FIGS. 54A and 54B have adhesives 51, 52, 53 applied to one side of each of them. The adhesives 52, 53, 54 are applied so as not to fill up the vacuum suction holes. That is, in the support member 45d shown in FIGS. 52A and 52B, the adhesive 52 is applied to the surface where a plurality of through holes 48 are not present. In the support member 45e shown in FIGS. 53A and 53B, the adhesive 53 is applied to the surface of the support member in such a manner that the adhesive 53 does not fill up a large number of holes made in the porous member 49 on whose side face the air leak prevention tool 50 is provided. In the support member 45f shown in FIGS. 54A and 54B, the adhesive 54 is applied to the surface of the area where the single hole 51 is not present.

The support members 45d, 45e, 45f shown in FIGS. 52A and 52B to FIGS. 54A and 54B may be applied to both cases where adhesive is applied to the surface of the porous adhesive tape 40 adhering to the support member and where no adhesive is applied to the surface of the porous adhesive tape 40 adhering to the support member.

When any one of the support members 45a to 45f is used, use of vacuum suction holes enables the semiconductor chips to adhere to the porous adhesive tape by vacuum suction by drawing air from the side of the support member 45a to 45f with the porous adhesive tape 40 being bonded to the support members 45a to 45f.

With the above-described configuration of the wafer adhering section using the porous adhesive tape 40, use of both vacuum suction and the adhesion of adhesive enables the adhesive of the porous adhesive tape 40 to be made lower than that of ordinary adhesive tape. Therefore, when the adhesive tape 24 is peeled, vacuum suction and the adhesion of adhesive cause the segmented semiconductor wafer to adhere strongly by suction. When the semiconductor chip 1 is picked up from the porous adhesive tape 40, it can be peeled easily by stopping or weakening the vacuum suction. This prevents damage to the semiconductor chip 1 and therefore improves the manufacturing yield.

As has been described above, according to an aspect of the present invention, there are provided an adhesive tape peeling mechanism, an adhesive tape peeling apparatus, an adhesive tape peeling method, a semiconductor chip pickup apparatus, a semiconductor chip pickup method, a semiconductor device manufacturing method, and a semiconductor device manufacturing apparatus which are capable of not only manufacturing high-quality semiconductor devices by decreasing such defects as cracks in chips or chipping but also suppressing a decrease in the manufacturing yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of peeling adhesive tape adhered to a semiconductor wafer segmented into a plurality of semiconductor chips, comprising:

fixing the wafer, adhered to the adhesive tape, to a porous member by applying a vacuum, the porous member having a plurality of suction areas each having first and second suction paths, the wafer being initially fixed by applying a vacuum to the suction areas via a first suction path;

peeling off the adhesive tape; and after the tape is peeled off portions of the wafer corresponding to each suction area, applying a vacuum to the corresponding suction area via the second suction path;

whereby the semiconductor chips of the wafer portions from which the adhesive tape has been peeled off are fixed to the porous member by a vacuum applied via the second suction path.

2. A method of peeling adhesive tape bonded to a semiconductor wafer segmented into a plurality of semiconductor chips, comprising:

placing the wafer on a holding table having a porous members, the porous member having a plurality of adhering areas;

fixing the wafer, bonded to the adhesive tape, to the holding table by a vacuum, the adhering areas each having a first and second suction path, the wafer being initially fixed by applying a vacuum to the adhering areas via the first suction path;

peeling off the adhesive tape; and after the tape is peeled off portions of the wafer corresponding to each adhering area, applying a vacuum to the corresponding adhering area via the second suction path;

whereby the semiconductor chips of the wafer portions from which the adhesive tape has been peeled off are fixed to the holding table by a vacuum applied via the second suction path.

* * * * *

UNITED STATES PATENT AND TRADEMARK OFFICE
CERTIFICATE OF CORRECTION

PATENT NO.        : 7,060,593 B2
APPLICATION NO.   : 10/254982
DATED             : June 13, 2006
INVENTOR(S)       : Kurosawa et al.

Page 1 of 1

It is certified that error appears in the above-identified patent and that said Letters Patent is hereby corrected as shown below:

Claim 2, column 21, line 2, change "a members" to --a member--.

Signed and Sealed this

Fifth Day of September, 2006

JON W. DUDAS
*Director of the United States Patent and Trademark Office*